(12) United States Patent
Palacios et al.

(10) Patent No.: US 12,176,454 B1
(45) Date of Patent: Dec. 24, 2024

(54) OPTICALLY CONTROLLED SEMICONDUCTOR DEVICES

(71) Applicant: Massachusetts Institute of Technology, Cambridge, MA (US)

(72) Inventors: Tomas Palacios, Belmont, MA (US); Jung-Han Hsia, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 18/627,725

(22) Filed: Apr. 5, 2024

Related U.S. Application Data

(60) Provisional application No. 63/506,143, filed on Jun. 5, 2023.

(51) Int. Cl.
*H01L 31/11* (2006.01)
*H01L 31/0352* (2006.01)
*H01L 31/113* (2006.01)
*H01L 31/028* (2006.01)
*H01L 31/0304* (2006.01)
*H01L 31/0312* (2006.01)
*H01L 31/032* (2006.01)

(52) U.S. Cl.
CPC .. *H01L 31/1136* (2013.01); *H01L 31/035281* (2013.01); *H01L 31/028* (2013.01); *H01L 31/03044* (2013.01); *H01L 31/03046* (2013.01); *H01L 31/0312* (2013.01); *H01L 31/032* (2013.01)

(58) Field of Classification Search
CPC ............. H01L 31/028; H01L 31/03044; H01L 31/03046; H01L 31/0312; H01L 31/032; H01L 31/035281; H01L 31/1136
See application file for complete search history.

(56) References Cited

U.S. PATENT DOCUMENTS

2012/0214275 A1* 8/2012 Mazzola ................ H01L 31/09
438/93

OTHER PUBLICATIONS

Meneghini et al., "GaN-based power devices: Physics, reliability, and perspectives"; Journal of Applied Physics 130; Nov. 2021; 84 pages.

(Continued)

*Primary Examiner* — Kevin K Pyo
(74) *Attorney, Agent, or Firm* — Daly, Crowley, Mofford & Durkee, LLP

(57) ABSTRACT

Described herein is a semiconductor structure, comprising: a drain region; a drift region comprised of a wide band gap material disposed over the drain region; and a channel structure disposed over the drift region. In some embodiments, the channel structure comprises: an optically active material disposed over the drift region, wherein the optically active material generates charge carriers in response to an optical signal; and a source region disposed over the optically active material, wherein in an off state charge carriers in the optically active material are depleted to turn off the semiconductor structure, and in an on state charge carriers in the optically active material conduct a current in the semiconductor structure when an electric field is applied across the source region and drain region, causing the current to substantially flow directly between the source region and the drain region.

20 Claims, 26 Drawing Sheets

(56) References Cited

OTHER PUBLICATIONS

Alves et al., "SiC Power Devices in Power Electronics: An Overview"; 2017 Brazilian Power Electronics Conference (COBEP); Nov. 2017; 8 pages.
Song et al., "15kV/40A FREEDM Super-Cascode: A Cost Effective SiC High Voltage and High Frequency Power Switch"; IEEE Transactions on Industry Applications, vol. 53, Issue: 6; Nov.-Dec. 2017; 8 pages.
Gill et al., "A Comparative Study of SiC JFET Super-Cascode Topologies"; 2021 IEEE Energy Conversion Congress and Exposition (ECCE); Oct. 2021; 8 pages.
Mojab et al., "Introducing Optical Cascode GaN HEMT"; IEEE Transactions on Electron Devices, vol. 64, No. 3; Mar. 2017; 9 pages.
Mitlehner et al., "A Novel 8 KV Light-Triggered Thyristor with Overvoltage Self Protection"; Proceedings of the 1990 International Symposium on Power Semiconductor Devices & ICs; Apr. 1990; 6 pages.
Sarkar et al., "Epitaxial Design of a Direct Optically Controlled GaAs/AlGaAs-Based Heterostructure Lateral Superjunction Power Device for Fast Repetitive Switching"; IEEE Transactions on Electron Devices, vol. 54, No. 3; Mar. 2007; 12 pages.
Giurgola et al., "Ultra thin nickel transparent electrodes"; J Mater Sci: Mater Electron (2009); Dec. 2007; 4 pages.
Nasiri et al., "Ultrathin Transparent Nickel Electrodes for Thermoelectric Applications"; Advanced Materials Interfaces; Dec. 2023; 8 pages.
Calarco et al., "Size-dependent Photoconductivity in MBE-Grown GaN-Nanowires"; Nano Letters, vol. 5, No., 5; Mar. 2005; 4 pages.
Chen et al., "High-voltage photoconductive semiconductor switches fabricated on semi-insulating HVPE GaN:Fe template"; Physica Status Solidi C 13, No. 5-6; Apr. 2016; 4 pages.
Mojab et al., "15-kV Single-Bias All-Optical ETO Thyristor"; Proceedings of the 26$^{th}$ International Symposium on Power Semiconductor Devices & IC's; Jun. 2014; 4 pages.
Ochiai et al., "Ultrahigh-responsivity waveguide-coupled optical power monitor for Si photonic circuits operating at near-infrared wavelengths"; Nature Communications; Dec. 2022; 8 pages.
Levinshtein et al., "Holding current and switch-on mechanisms in 12kV, 100 A 4H-SiC optically triggered thyristors"; Semiconductor Science and Technology 28; Nov. 2012; 6 pages.
Cho et al., "Electron capture behaviors of deep level traps in unintentionally doped and intentionally doped n-type GaN"; Journal of Applied Physics, vol. 94, No. 3; Aug. 2003; 6 pages.
Zhou et al., "7.6 V Threshold Voltage High-Performance Normally-Off $Al_2O_3$/GaN MOSFET Achieved by Interface Charge Engineering"; IEEE Electron Device Letters, vol. 37, No. 2; Feb. 2016; 4 pages.
Zhao et al., "The role of traps in the photocurrent generation mechanism in thin InSe photodetectors"; Materials Horizons, 2020, 7; Sep. 2019; 11 pages.
Shin et al., "Photogating Effect-Driven Photodetectors and Their Emerging Applications"; Nanomaterials 2023, 13, 882; Feb. 2023; 21 pages.
Armstrong et al., "Deep level optical spectroscopy of GaN nanorods"; Journal of Applied Physics 106; Sep. 2009; 8 pages.
Yang et al., "The enhanced photo absorption and carrier transportation of InGaN/GaN Quantum Wells for photodiode detector applications"; Scientific Reports 7; Feb. 2017; 6 pages.
Wang et al., "AlGaN/GaN MIS-HEMTs With High Quality ALD-$Al_2O_3$ Gate Dielectric Using Water and Remote Oxygen Plasma As Oxidants"; Journal of the Electron Devices Society, vol. 6; Dec. 2017; 6 pages.
Perozek, "Vertical Gallium Nitride Fin Transistors for RF Applications"; Department of Electrical Engineering and Computer Science at Massachusetts Institute of Technology; Feb. 2020; 80 pages.
U.S. Energy Information Administration (EIA), Independent Statistics and Analysis; accessible online at: https://www.eia.gov/; accessed: May 3, 2024; 3 pages.
Sztykiel et al., "Modular Multilevel Converter Modelling, Control, and Analysis under Grid Frequency Deviations"; 2013 15th European Conference on Power Electronics and Applications (EPE); Sep. 2013; 11 pages.
Huang et al., "Highly Sensitive Visible to Infrared $MoTe_2$ Photodetectors Enhanced by the Photogating Effect"; Nanotechnology 27 (2016); Sep. 2016; 7 pages.
Rounds et al., "Thermal conductivity of GaN single crystals: Influence of impurities incorporated in different growth processes"; Journal of Applied Physics 124; Sep. 2018; 7 pages.
Niemeyer et al., "Measurement of the non-radiative minority recombination lifetime and the effective radiative recombination coefficient in GaAs"; AIP Advances 9, 045034; Apr. 2019; 7 pages.
Meyer et al., "Systematic study of shockley-read-hall and radiative recombination in GaN on $Al_2O_3$, free standing GaN, and GaN on Si"; Journal of Physics: Photonics 2; Jun. 2020; 9 pages.
Dan et al., "A Photoconductor Intrinsically Has No Gain"; ACS Photonics 5; Sep. 2018; 13 pages.
Tokuda, "Traps in MOCVD n-GaN Studied by Deep Level Transient Spectroscopy and Minority Carrier Transient Spectroscopy"; CS MANTECH Conference; May 2014; 6 pages.
Yamada et al., "Deep-level traps in lightly Si-doped n-GaN on free-standing m-oriented GaN substrates"; AIP Advances 8; 045311; Apr. 2018; 9 pages.
Kharei et al., "An insight to current collapse n GaN HEMT and suppressing techniques"; Engineering Research Express 5; Jan. 2023; 17 pages.
Chowdhury et al., "CAVET on Bulk GaN Substrates Achieved With MBE-Regrown AiGaN/GaN Layers to Suppress Dispersion"; IEEE Electron Device Letters, vol. 33, No. 1; Jan. 2012; 3 pages.
Zhang et al., "Switching Performance Evaluation of 650 V Vertical GaN Fin JFET"; 2023 IEEE Applied Power Electronics Conference and Exposition (APEC); Mar. 2023; 5 pages.
Sun, "Vertical Gallium Nitride Power Devices on Bulk Native Substrates"; Department of Electrical Engineering and Computer Science at Massachusetts Institute of Technology; Jun. 2017; 151 pages.
Hiller et al., "The negative fixed charge of atomic layer deposited aluminum oxide—a two-dimensional $SiO_2/AlO_x$ interface effect"; Journal of Physics D: Applied Physics 54; Apr. 2021; 6 pages.
Chen et al., "Physics of Fluorine Plasma Ion Implantation for GaN Normally-off HEMT Technology"; 2011 International Electron Devices Meeting; Dec. 2011; 4 pages.
Ji et al., "Experimental Determination of Velocity-Field Characteristic of Holes in GaN"; IEEE Electron Device Letters, vol. 41, No. 1; Jan. 2020; 3 pages.
Al Taradeh et al., "Characterization of m-GaN and a-Gan Crystallographic Planes after Being Chemically Etched in TMAH Solution"; Energies 2021, 14, 4241; Jul. 2021; 10 pages.
Von Gastrow et al., "Ozone-based bath atomic layer deposited Al2O3 for effective surface passivation"; Energy Procedia 38 (2013); Mar. 2013; 5 pages.
Long et al., "Interface trap evaluation of Pd/Al2O3/GaN metal oxide semiconductor capacitors and the influence of near-interface hydrogen"; Applied Physics Letters 103, Jul. 2016; Nov. 2013; 5 pages.
Engel-Herbert et al., "Comparison of methods to quantify interface trap densities at dielectric/III-V semiconductor interfaces"; Journal of Applied Physics 108; Dec. 2010; 16 pages.
Meunier et al., "AlGaN/GaN MIS-HEMT Gate Structure Improvement Using $Al_2O_3$ Deposited by PEALD and $BCl_3$ Gate Recess Etching"; ECS Transactions, 58 (4); Sep. 2013; 10 pages.
Allers, "Prediction of dielectric reliability from I-V characteristics: Poole-Frenkel conduction mechanism leading to $\sqrt{E}$ model for silicon nitride MIM capacitor"; Microelectronics Reliability 44; Nov. 2003; 13 pages.
Reeves, "Specific Contact Resistance Using a Circular Transmission Line Model"; Solid-State Electronics, vol. 23; Jul. 1979; 4 pages.
Berger, "Models for Contacts to Planar Devices*"; Solid-State Electronics, vol. 15; Jun. 1971; 14 pages.
Greco et al., "Ohmic contacts to Gallium Nitride materials"; Applied Surface Science 383; Apr. 2016; 22 pages.

(56) References Cited

OTHER PUBLICATIONS

Ozbek, "Measurement of Impact Ionization Coefficients in GaN"; North Carolina State University Dissertation; 2012; 91 pages.

Gonzalez et al., "Charge trapping analysis of $Al_2O_3$ films deposited by atomic layer deposition using $H_2O$ or $0_3$ as oxidant"; Journal of Vacuum Science and Technology B; Nov. 2012; 7 pages.

Galeckas et al., "Time-resolved imaging of radiative recombination in 4H-SiC p-i-n diode"; Applied Physics Letters vol. 74, No. 22; May 1999; 4 pages.

Visvkarma et al., "Comparative study of Au and Ni/Au gated AlGaN/GaN high electron mobility transistors"; AIP Advances 9, 125231; Dec. 2019; 6 pages.

Li et al., "Addressing gain-bandwidth trade-off by a monolithically integrated photovoltaic transistor"; Science Advances, Research Article; Sep. 2022; 10 pages.

Mazumder, "An Overview of Photonic Power Electronic Devices"; IEEE Transactions on Power Electronics, vol. 31, No. 9; Sep. 2016; 13 pages.

Leach et al., "High voltage, bulk GaN-based photoconductive switches for pulsed power applications"; Proceedings of SPIE, vol. 8625; Mar. 2013; 7 pages.

Koehler et al., "High Voltage GaN Lateral Photoconductive Semiconductor Switches"; ECS Journal of Solid State Science and Technology, 6 (11); Oct. 2017; 5 pages.

Sun, "High-Performance GaN Vertical Fin Power Transistors on Bulk GaN Substrates"; IEEE Electron Device Letters, vol. 38, No. 4; Apr. 2017; 4 pages.

Zhang et al., "Large-Area 1.2-kV GaN Vertical Power FinFETs With a Record Switching Figure of Merit"; IEEE Electron Device Letters, vol. 40, No. 1; Jan. 2019; 4 pages.

DeLuca et al., "Transparent Quasi-Interdigitated Electrodes for Semitransparent Perovskite Back-Contact Solar Cells"; ACS Applied Energy Materials; Aug. 2018; 6 pages.

Hsia, "Optically Controlled Vertical GaN finFET for Power Applications"; Department of Electrical Engineering and Computer Science at Massachusetts Institute of Technology; Sep. 2023; 87 pages.

Le et al., "CMOS Integrated Optical Isolator for Power Transistor Gate Driver"; IECON 2014—40th Annual Conference of the IEEE Industrial Electronics Society; Oct.-Nov. 2014; 7 pages.

Perez et al., "Modular Multilevel Converters: Recent Achievements and Challenges"; IEEE Open Journal of the Industrial Electronics Society, vol. 2; Feb. 2021; 16 pages.

Armstrong et al., "Impact of carbon on trap states in n-type GaN grown by metalorganic chemical vapor deposition"; Applied Physics Letters, vol. 84, No. 3; Jan. 2004; 4 pages.

Hsia et al., "First Demonstration of Optically-Controlled Vertical GaN finFET for Power Applications"; IEEE Electron Device Letters; Mar. 2024; 4 pages.

\* cited by examiner

OPTICALLY CONTROLLED SEMICONDUCTOR DEVICES

CROSS REFERENCE TO RELATED APPLICATIONS

This application claims the benefit under 35 U.S.C. § 119 of U.S. Provisional Patent Application No. 63/506,143 filed on Jun. 5, 2023, which is hereby incorporated by reference herein in its entirety.

STATEMENT REGARDING FEDERALLY SPONSORED RESEARCH

This invention was made with government support under N00014-22-1-2468 awarded by the Office of Naval Research. The government has certain rights in the invention.

BACKGROUND

Medium to high voltage (e.g., a voltage between 5 kV-50 kV) power electronics are important for efficient grid energy distribution, automotive, and pulsed power systems. However, the breakdown voltage of a single power transistor is typically well below the required blocking voltage for such applications. As an example, a conventional silicon carbide (SiC) metal-oxide-semiconductor field-effect transistor (MOSFET) can withstand voltages in the range of about 1.2 kV to about 1.7 kV (+/−0.1 kV). To build circuits with high voltage blocking capabilities (e.g., a voltage between 100 kV to 1000 kV), power transistors are often stacked serially. The stacking of electrically driven power transistors for high-voltage operation poses many problems and challenges, some of which include: (1) complex gate driving scheme; (2) significant electromagnetic interference (EMI); and (3) reliability and control issues caused by gate driver oscillations. All of which lead to complex, expensive, bulky, and unreliable power systems.

SUMMARY OF DISCLOSED EMBODIMENTS

In accordance with one aspect of the concepts described herein, it has been recognized that optically driven power devices provide complete galvanic isolation between a low-voltage (e.g., a voltage between 5-20 V) (e.g., a voltage appropriate for a gate driver for optical signals which may, for example, be provided from a light emitting diode (LED)), control signal and a high-voltage transistor stack. Thus, allowing an electromagnetic interference (EMI)-immune driving scheme that enables the use of driver circuits which are relatively simple (or less complex) compared with driver circuits required for use with serially stacked power transistors circuits.

Such relatively simple driver circuits are relatively compact and cost-effective (compared with other driver circuits) for use with high-voltage, high-current (e.g., a current between 100 A-1000 A) power system applications (e.g., applications, such as: mega-watt (MW) high-voltage direct current (HVDC) power delivery—i.e., voltage in the range of about 100 V-1000 V and current in the range of 1000s of amperes).

Conventional optically triggered devices may use phototransistors provided from narrow band gap materials to drive power switches indirectly and are therefore not fully utilizing the advantages of optical control.

In contrast to conventional approaches and in accordance with a further aspect of the concepts described herein, the described concepts, structures and techniques are directed towards direct optical control of wide band gap semiconductor power switches and address difficulties in using short wavelength optical sources that are required to trigger band-to-band optical generation in wide band gap semiconductors.

In one aspect, the present disclosure is directed towards an optically controlled, wide band gap semiconductor power device. The device comprises optically active channels, a drift region comprising a wide band gap material that produces or absorbs reactive power to maintain a voltage when the semiconductor power device is in an off state, and source and drain regions to provide current when the semiconductor power device is in an on state. Such a structure allows the device to be fabricated on an epi structure (e.g., an epitaxial film or an epitaxial layer) with the same dopant type (p-type or n-type). The triggering wavelength (i.e., the wavelength of an optical signal to which the device is responsive) can be increased by heterogeneous integration of narrow band gap materials or embedded light-absorbing structures with wide band gap semiconductor materials. In embodiments, two or more devices may be stacked serially and directly controlled by isolated optical sources without needing additional electrical drivers.

According to a further aspect of the disclosure, a semiconductor structure comprises: a drain region; a drift region comprised of a wide band gap material disposed over the drain region; and a channel structure disposed over the drift region, the channel structure comprising: an optically active material disposed over the drift region, wherein the optically active material generates charge carriers in response to an optical signal; and a source region disposed over the optically active material, wherein in an off state charge carriers in the optically active material are depleted to turn off the semiconductor structure, and in an on state charge carriers in the optically active material conduct a current in the semiconductor structure when an electric field is applied across the source region and drain region, causing the current to substantially flow directly between the source region and the drain region.

In some embodiments, the wide band gap material comprises one or more of: gallium nitride (GaN), aluminum gallium nitride ($Al_xGa_yN$, x+y=1), aluminum nitride (AlN), boron aluminum nitride ($B_xA_yIN$, x+y=1), gallium oxide ($Ga_2O_3$), silicon carbide (SiC), diamond, or boron nitride (BN). In some embodiments, the drain region, the drift region, and the source region have the same type of net electrical carriers. In some embodiments, the channel structure is nanostructured with a width less than 1 μm. In some embodiments, the optically active material includes one or more energy levels with an energy level to conduction band difference greater than 0.5 eV. In some embodiments, the semiconductor structure further comprises a stack including a first layer comprised of a dielectric material disposed over the drift region and the optically active material and a second layer comprised of a semi-transparent or transparent conductive oxide disposed over the first layer. In some embodiments, the semiconductor structure further comprises a material layer with a net carrier type opposite to that of the optically active material disposed over the optically active material and the drift region. In some embodiments, the optically active material further comprises a narrow band gap material or a material with net carrier type opposite to that of the source and drain regions. In some embodiments, the semiconductor structure further comprises a narrow band gap absorber disposed over the optically active material and the drift region, wherein the narrow band gap absorber comprises one or more of: organic molecules, colloidal quantum dots, two dimensional materials, group IV elements, or III-nitride alloys. In some embodiments, the semiconductor structure further comprises an interdigitated probe pad with a region partially covering the channel structure to electrically contact the source region and an optically transparent window to receive the optical signal and allow the optically active material to generate charge carriers in the channel structure. In some embodiments, the region and the optically transparent window have a lower refractive index than the optically active material to form one or more optical signal guiding structures, wherein the optical signal guiding structures are optical probes to probe device operation. In some embodiments, two or more semiconductor devices are stacked serially to block a total output voltage greater than 30 V. In some embodiments, the one or more semiconductor devices further comprises a light source, wherein the light source is a light emitting diode (LED), laser, or an broadband light source.

According to another aspect of the disclosure, a semiconductor structure comprises: a drift region comprised of a wide band gap material; a barrier region disposed over the drift region; one or more channels at the interface of the barrier region and the drift region; a source contact disposed on a first surface of the barrier region to form a source region in electrical communication with at least some of the one or more channels; a drain contact disposed on the first surface of the barrier region to form a drain region in electrical communication with at least some of the one or more channels and adjacent to the source region; and an optically active material disposed over the first surface of the barrier region between the source contact and the drain contact, wherein the optically active material generates charge carriers in response to an optical signal, wherein in an off state charge carriers in the channels are depleted to turn off the semiconductor structure, and in an on state charge carriers in the channels conduct a current in the semiconductor structure when an electric field is applied across the source region and the drain region, causing current to substantially flow through at least some of the one or more channels directly between the source region and the drain region.

In some embodiments, the wide band gap material comprises one or more of: gallium nitride (GaN), aluminum gallium nitride ($Al_xGa_yN$, x+y=1), aluminum nitride (AlN), boron aluminum nitride ($B_xAl_yN$, x+y=1), gallium oxide ($Ga_2O_3$), silicon carbide (SiC), diamond, or boron nitride (BN). In some embodiments, the channels are nanostructured. In some embodiments, the semiconductor structure further comprises a narrow band gap absorber disposed over the channels, wherein the narrow band gap absorber comprises one or more of: organic molecules, colloidal quantum dots, two dimensional materials, group IV elements, or III-nitride alloys. In some embodiments, the optically active material comprises a material with a net electrical carrier type opposite to that of the channel. In some embodiments, the semiconductor structure further comprises a region partially covering the channel to electrically contact the source region and an optically transparent window to receive the optical signal and allow the optically active material to generate charge carriers in the channel, wherein the region and the optically transparent window have a lower refractive index than the channel to form one or more optical signal guiding structures, wherein the optical signal guiding structures are optical probes to probe device operation. In some embodiments, two or more semiconductor devices are stacked serially to block a total output voltage greater than 30 V and are coupled to a light source, wherein the light source is a light emitting diode (LED), laser, or broadband light source.

According to a still further aspect of the disclosure, a method for forming a semiconductor structure comprises: disposing a drain region; disposing a drift region comprised of a wide band gap material over the drain region; and disposing a fin structure over the drift region. In some embodiments, disposing the fin structure comprises: disposing a channel comprised of an optically active material over the drift region, wherein the optically active material generates charge carriers in response to an optical signal; and disposing a source region over the channel, wherein in an off state the charge carriers in the channel are depleted to turn off the semiconductor structure, and in an on state the charge carriers in the nanostructured channel conduct a current in the semiconductor structure when an electric field is applied across the source region and drain region, causing the current to flow directly between the source region and the drain region.

In some embodiments, the wide band gap material comprises one or more of: gallium nitride (GaN), aluminum gallium nitride ($Al_xGa_yN$, x+y=1), aluminum nitride (AlN), boron aluminum nitride ($B_xAl_yN$, x+y=1), gallium oxide ($Ga_2O_3$), silicon carbide (SiC), diamond, or boron nitride (BN). In some embodiments, the drain region, the drift region and the source region have the same type of net electrical carriers. In some embodiments, the channel is nanostructured with a width less than 1 μm.

DESCRIPTION OF THE SEVERAL VIEWS OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, embodiments are illustrated by way of example and not limitation in the figures, in which.

DETAILED DESCRIPTION

Figure 1A:
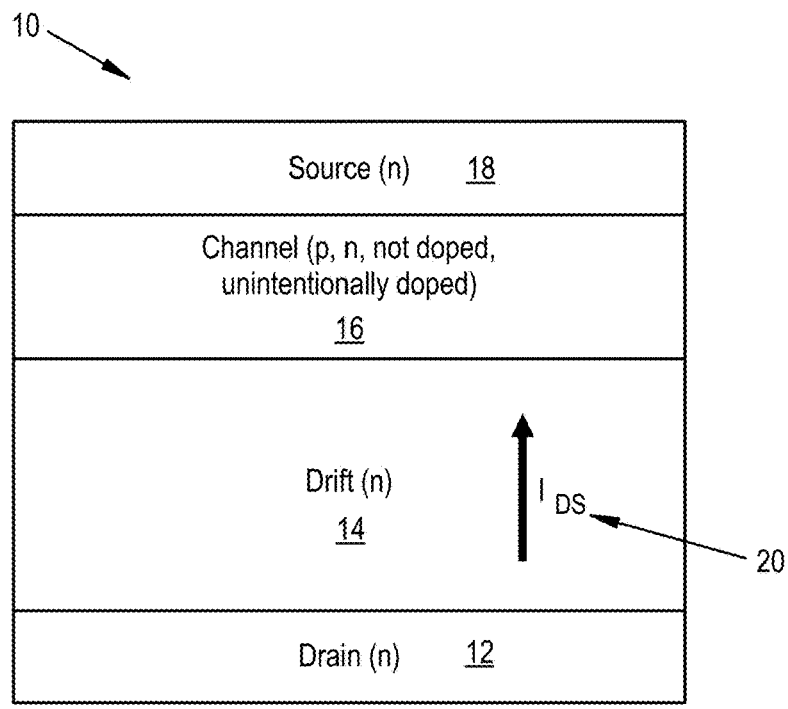
FIG. 1A is a side cross-sectional view of an optically controlled, semiconductor power device comprising a wide band gap material.

Referring now to FIG. 1A, an optically controlled, wide band gap semiconductor power device 10, includes a drift region 14 disposed over (here directly on) a drain region 12. The drift region 14 is comprises a wide band gap material (wide meaning a material with a band gap greater than 2 eV). The wide band gap material may comprise one or more of: gallium nitride (GaN), aluminum gallium nitride ($Al_xGa_yN$, x+y=1), aluminum nitride (AlN), boron aluminum nitride ($B_xA_yIN$, x+y=1), gallium oxide ($Ga_2O_3$), silicon carbide (SiC), diamond, or boron nitride (BN). A channel structure 16 (or more simply "channel" 16) comprised of an optically active material is disposed over (here directly on) the drift region 14. The optically active material generates charge carriers in response to an optical signal. A source region 18 is disposed over (here directly on) the channel 16. The channel 16, source region 18, and drain region 12 may comprise a wide band gap material or a narrow band gap material (narrow meaning a material with a band gap less than 0.5 eV). Together, the source region 18, channel 16, drift region 14, and drain region 12 form an optically controlled gallium nitride (GaN) vertical transistor.

In an "on" state (i.e., with the device 10 biased (or activated) into its conductive or low resistance state by a direct optical signal impinging upon or otherwise illuminating the channel 16), charge carriers (electrons for n-channel devices and holes for p-channel devices with charge carriers sometimes referred to herein simply as "charges" or "carriers") generated in the channel 16 modulate the device current. Since the "on state" is achieved by a directly exposing the channel to an optical signal, the "on state" may sometimes be referred to herein as the "illuminated state."

The charge carriers in the channel 16 conduct a current in the device 10 when an electric field is applied across the source region 18 and drain region 12, causing the current to substantially flow directly between the source region 18 and the drain region 12. In the "off" state (i.e., with no optical signal impinging on the device 10), the charge carriers in the channel 16 are depleted to turn off the device 10. The off state may sometimes be referred to herein as the "dark state."

Accordingly, device 10 is turned on by illuminating the channel 16 (and preferably, by direct illumination of the channel 16) and turned off in the absence of the optical signal (i.e., removing the light (e.g. by turning a light source off) or preventing the light from reaching the channel—e.g., by blocking the light). Direct illumination of the channel 16 meaning the illumination is provided directly from an illumination source to the channel 16 such that the channel 16 absorbs the illumination and generates carriers directly. While the illumination need not be focused on the channel 16, a focused illumination on the channel 16 may provide improved efficiency. The illumination may be provided from one or both sides of the device 10, with illumination from both sides providing improved efficiency. In embodiments, a light source may provide a collimated or a diffuse beam of light (i.e., light rays may or may not travel in parallel).

Due to channel depletion, the drift region 14 is capable of blocking a high drain voltage in the off state. The current may flow between the source region 18 and the drain region 12, in the on state upon illumination, and the charge carriers in the channel 16 conducts a current in the device 10 when an electric field is applied across the source region 18 and drain region 12 (e.g., the current substantially flows from the drain region 12 to the source region 18, which is demonstrated by arrow 20). As will be described below in some embodiments, the current may flow vertically between the source region and the drain region (e.g. see FIG. 1B) while in other embodiments, the current may flow laterally between the source region and the drain region (See FIG. 4A).

In an embodiment, the drain region 12, the drift region 14, and source region 18 have the same type of net electrical carriers, while the channel has a different type of net carrier. The channel 16 may be doped with a p-type dopant (either heavily or lightly), an n-type dopant (either heavily or lightly), not doped, or unintentionally doped. The drain region 12, drift region 14, channel 16, and source region 18 may be doped with the same dopant type (p-type or n-type). The drain region 12, the drift region 14, and source region 18 may be doped with an n type dopant, while the channel is doped with a p type dopant or near-intrinsic. Following, a vertical p-n junction is formed by the differing dopant types and the channel 16 is depleted in a direction parallel to the current flow. Accordingly, the current direction depends on the dopant type. If the channel has the same net carrier type as the source, drain, and drift, due to the conductive nature of the channel 16, additional auxiliary structures (auxiliary structures referring to the traps disclosed in FIG. 1B, the semi-transparent metal-oxide gate stack disclosed in FIG. 1C, and the wide band gap material with opposite net carrier type to the channel disclosed in FIG. 1D) may be incorporated to deplete the nanostructured fin channels (which will be discussed below in relation to said FIGS. 1B-1D) and achieve normally off operation in the transistor.

Figure 1B:
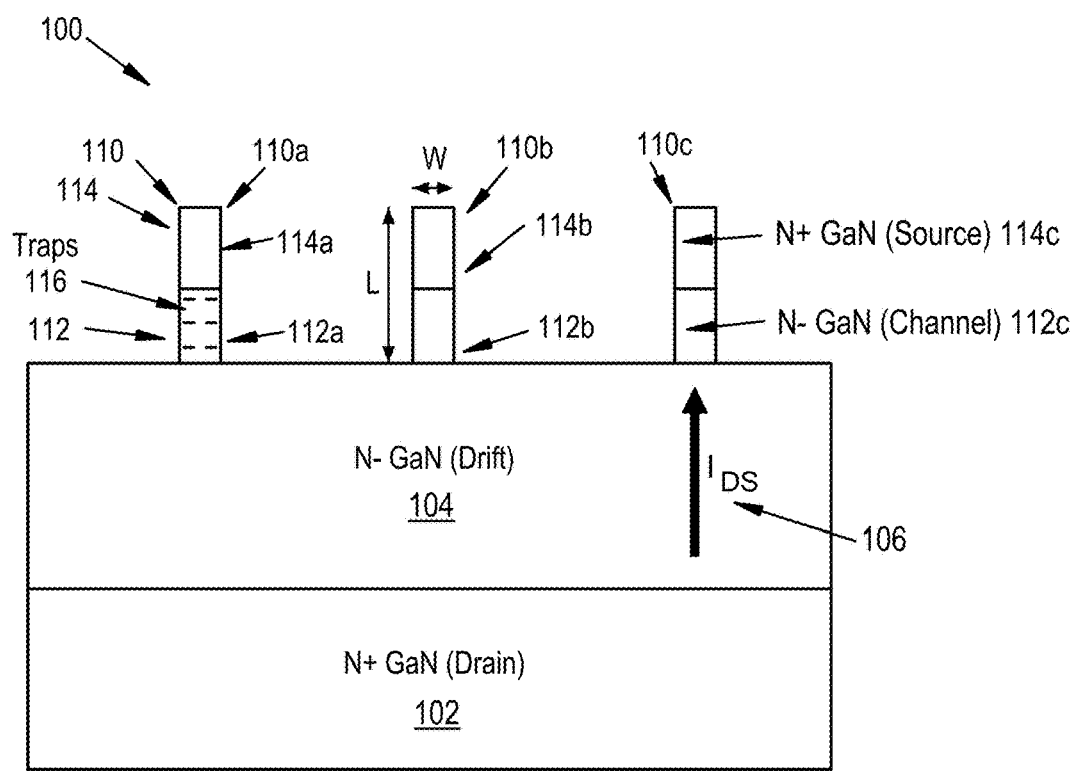
FIG. 1B is a side cross-sectional view of an optically controlled, wide band gap semiconductor power device, including one or more trap states (donor or acceptor) embedded in a channel.

FIG. 1B is a side cross-sectional view of a semiconductor power device 100 including a drift region 104 (which may be similar to or the same as drift region described above in conjunction with FIG. 1A), disposed over a drain region 102 (which may be similar to or the same as drain region described above in conjunction with FIG. 1A). The drain region 102 may be heavily doped with an N type dopant. The drift region 104 is formed from a wide band gap material (wide meaning a material with a band gap greater than 2 eV) and may be lightly doped with an N type dopant. One or more fin structures 110a-110c, generally denoted 110, are formed from or otherwise comprise respective ones of nanostructured channel structures 112a-112c, generally denoted 112 (or more simply channels 112) and respective source structures 114a-114c, generally denoted 114 (or more simply sources 114), with the channels 112 disposed over (here directly on) the drift region 104 and the sources 114 disposed over (here directly on) respective ones of the channels 112. Channels 112 comprise an optically active material. Thus, together the channels 112, sources 114, drain region 102, and drift region 104 form an optically controlled gallium nitride (GaN) vertical fin transistor. In the on state, upon illumination, the channel conducts a current in the device 100 when an electric field is applied across the sources 114 and drain region 102 (the current flows from the drain region 102 to the sources 114, which is demonstrated by arrow 106).

A first fin structure 110a includes a first channel 112a disposed over (and here directly on) the drift region 104 and a first source 114a disposed over (and here directly on) the first channel 112a. A second fin structure 110b includes a second channel 112b disposed over (and here directly on) the drift region 104 and a second source 114b disposed over (and here directly on) the second channel 112b. A third fin structure 110c includes a third channel 112c disposed over (and here directly on) the drift region 104 and a third source 114c disposed over (and here directly on) the third channel 112c. The fin structures 110 each have a width W less than 1 μm, such that the channels 112 is depleted from the direction perpendicular to the current flow. Accordingly, the channels 112 are nanostructured with a width less than 1 μm. The channels 112 and sources 114 are nanostructured with a width less than 1 μm.

If the fins structures are wide (e.g., a width greater than 5 microns) the lateral field provided by the metal oxide stack, or interface charges, will not be strong enough to fully deplete the channels 112. Accordingly, there will be a conductive region in the channels 112 in the off state, and the voltage will not be blocked. The length L of the fin structures 110 may be selected to achieve (and ideally optimize) a desired current capability.

In embodiments, the fin structures 110 may each have a width less than 500 nm. In embodiments, the fins structures 110 may have a width of 75 nm, 100 nm, or 150 nm. The source 114 may be formed from a wide band gap material and in embodiments may be heavily doped with an N type dopant (e.g., for GaN, an N type dopant greater than 1e18 cm$^{-3}$). The channel 112 may be formed from a wide band gap material and in embodiments may be lightly doped with an N type dopant (e.g., for GaN, an N type dopant between 1e16 cm$^{-3}$ to 1e17 cm$^{-3}$). The drain region 102, drift region 104, channels 112, and source 114 may be doped with the same dopant type (p-type or n-type).

In embodiments, one or more of channels 112a-112c may be doped to embed or otherwise introduce one or more energy levels (energy levels may be referred to herein as "traps"—i.e. a crystalline defect which leaves a dangling bond to which a charge may be coupled to complete an atom's valence) and/or one or more deep donors or acceptors (charged states) 116 into one or all of the channel structures 112a-112c. Deep referring to an energy level to conduction band difference greater than 0.5 eV. Accordingly, the channels 112 include one or more energy levels with an energy level to conduction band difference greater than 0.5 eV. The trap/charged states can potentially be activated optically to increase the channels 112 conductivity. Such trap/charged states embedding may be accomplished, for example, via an implantation technique/process (i.e., ion implantation) or by any other technique/process now known or later discovered. For example, the charged states may be embedded by adding dopants, such as carbon (C) or magnesium (Mg), to the channel layer during processing. In the example embodiment of FIG. 1B, the first channel 112a includes traps/charged states. In alternative embodiments, all of the channels may include traps/charged states. Embedding additional negatively charged states 116 on fin sidewalls (e.g., in a direction across the width W of the fin structures 110) enhances the lateral electric field across the fin structures 110. The traps/charged states 116 allow sub-band gap optical triggering of the device 100 and increased optical gain due with proper engineering of the trap time constants.

The traps/charged states decrease speed of the device turn-off, this is especially true when the traps/charged states are deep. One advantage of deep traps/charged states is an increase in optical gain (e.g., more efficient generation of carriers with low intensity light) due to the long-time constants, at the expense of the slow turn-off time. For high power switching applications, the device turn-off time is not crucial (e.g., the device does not need to switch that fast), accordingly the energy level for the traps may be selected (and ideally optimized) to balance the trade-offs between gain and frequency. Thus, the device is suitable for use as a semiconductor power switches (e.g. a switch comprising GaN).

Figure 1C:
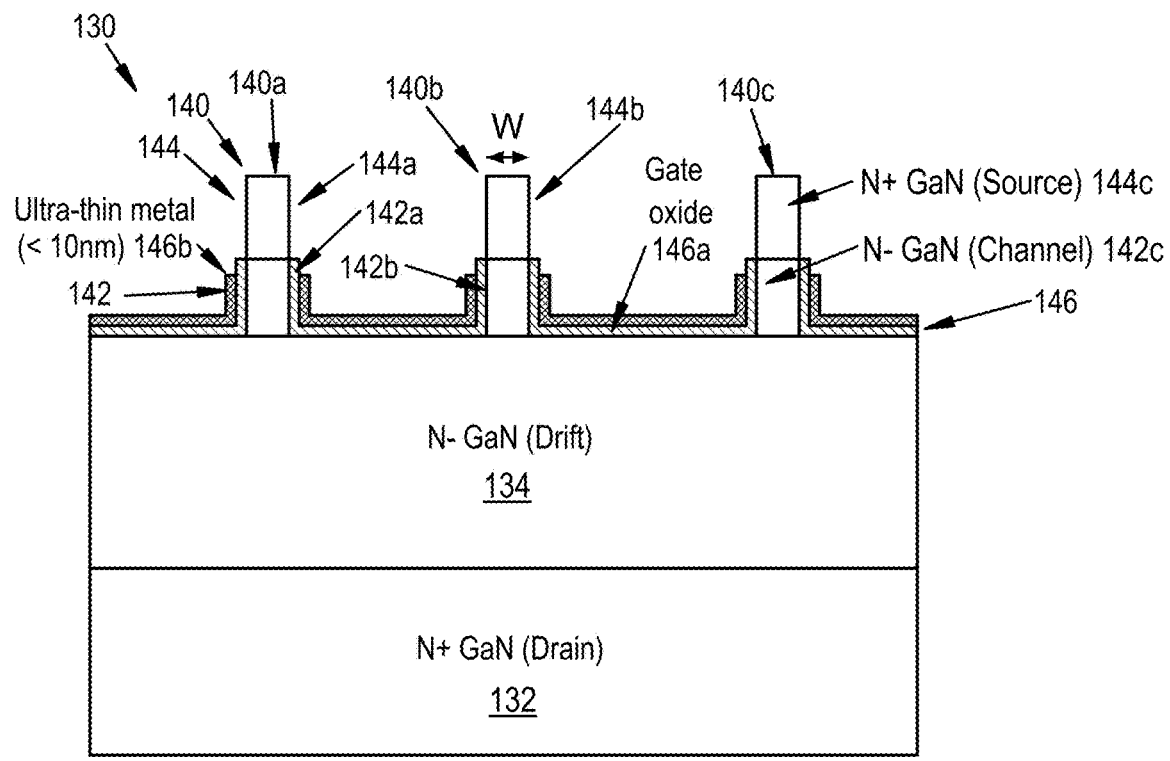
FIG. 1C is a side cross-sectional view of an optically controlled, wide band gap semiconductor power device, including a semi-transparent metal-oxide gate stack disposed on the device.

FIG. 1C is a side cross-sectional view of an optically controlled, wide band gap semiconductor power device 130, including a drift region 134 (which may be similar to or the same as drift region described above in conjunction with FIG. 1A) disposed over a drain region 132 (which may be similar to or the same as drain region described above in conjunction with FIG. 1A). One or more fin structures 140a-140c, generally denoted 140, are formed or otherwise comprise respective ones of nanostructured channel structures 142a-142c, generally denoted 142 (or more simply channels 142), and respective source structures 144a-144c, generally denoted 144 (or more simply sources 144), with the channels 142 disposed over (here directly on) the drift region 134 and the sources 144 disposed over (here directly on) respective ones of the channels 142. Channels 142 comprise an optically active material. In embodiments, a semi-transparent metal-oxide or a transparent conductive oxide gate stack 146 is disposed over (here directly on) the channels 142 and the drift region 134.

The fin structures 140 each have a width W less than 1 μm. Accordingly, the channels 142 and sources 144 are nanostructured with a width less than 1 μm. The fins 140 may each have a width less than 500 nm. A first fin structure 140a includes a first channel 142a disposed over (here directly on) the drift region 134 and a first source 144a disposed over (here directly on) the first channel 142a. A second fin structure 140b includes a second channel 142b disposed over (here directly on) the drift region 134 and a second source 144b disposed over (here directly on) the second channel 142b. A third fin structure 140c includes a third channel 142c disposed over (here directly on) the drift region 134 and a third source 144c disposed over (here directly on) the third channel 142c. The channels 142 may be formed from a wide band gap material, such as GaN, and may be doped lightly with an N type dopant. The sources 144 may be formed from a wide band gap material, such as GaN, and may be doped heavily with an N type dopant.

The stack 146 is formed from a first layer 146a and a second layer 146b. The first layer 146a is disposed over (here directly on) the drift region 134 and the channels 142. The first layer 146a may be a dielectric material, such as a gate oxide. The first layer 146a may be nickel (Ni), with thickness less than 10 nm. The second layer 146b is disposed over (here directly on) the first layer 146a. The second layer 146b is a semi-transparent or transparent conductive oxide, such as indium tin oxide (ITO). The second layer 146b may be an ultra-thin metal (ultra-thin referring to a layer that is less than 10 nm thick). The stack 146 could be deposited over the sidewall of the channels 142 and the drift region 134. Accordingly, the stack 146 may be deposited vertically or laterally direction.

The stack 146 can be incorporated, just like a normally-off, electrically triggered fin field-effect transistor (finFET), with the gate terminal grounded by the source.

Figure 1D:
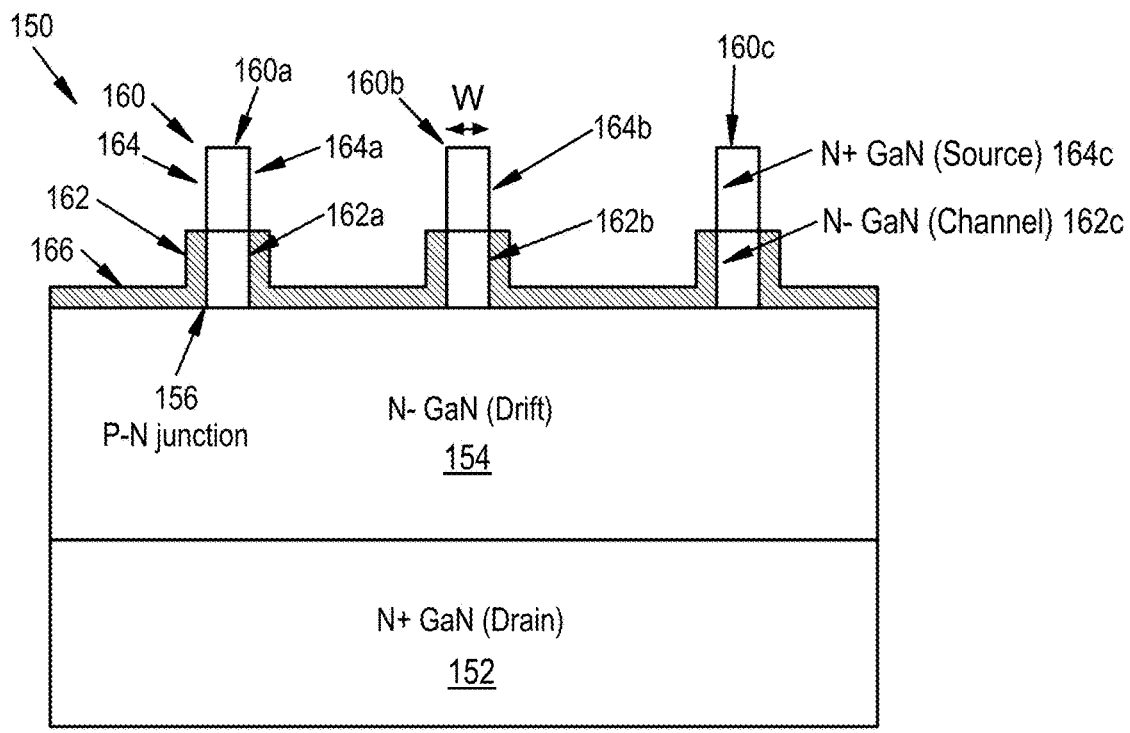
FIG. 1D is a side cross-sectional view of an optically controlled, wide band gap semiconductor power device, including a material with a net carrier type opposite to the channel disposed on the device.

FIG. 1D is a side cross-sectional view of an optically controlled, wide band gap semiconductor power device 150, including a drift region 154 (which may be similar to or the same as drift region described above in conjunction with FIG. 1A) disposed over a drain region 152 (which may be similar to or the same as drain region described above in conjunction with FIG. 1A). One or more fin structures 160a-160c, generally denoted 160, are formed or otherwise comprise respective ones of nanostructured channel structures 162a-162c, generally denoted 162 (or more simply channels 162), and respective source structures 164a-164c, generally denoted 164 (or more simply sources 164) with the channels 162 disposed over (here directly on) the drift region 154 and the sources 164 disposed over (here directly on) respective ones of the channels 162. Channel structures 162 comprise an optically active material. In embodiments, a material layer 166 is disposed over (here directly on) the channels 162 and the drift region 154. Material layer 166 has a net carrier type opposite to that of the channels 162.

The fin structures 160 each have a width W less than 1 μm. Accordingly, the channels 162 and sources 164 are nanostructured with a width less than 1 μm. The fin structures 160 may each have a width less than 500 nm. A first fin structure 160a includes a first channel 162a disposed over (here directly on) the drift region 154 and a first source 164a disposed over (here directly on) the first channel 162a. A second fin structure 160b includes a second channel 162b disposed over (here directly on) the drift region 154 and a second source 164b disposed over (here directly on) the second channel 152b. A third fin structure 160c includes a third channel 152c disposed over (here directly on) the drift region 154 and a third source 164c disposed over (here directly on) the third channel 162c. The sources 144 may be formed from a wide band gap material and may be heavily doped with an N type dopant.

The channels 162 are doped with a first dopant type, while the material layer 116 has an opposite dopant type compared to the dopant type of the channels 162. The channels 162 may be formed from a wide band gap material and may be lightly doped with an N type dopant. The material layer 166 may be a p-type material (e.g., nickel oxide (NiOx), regrown GaN). Accordingly, a p-n junction (demonstrated by arrow 156) can be incorporated by heterogenous integration with the wide band gap material layer 166. A junction field-effect transistor (JFET) structure can also be used with a regrowth of p-GaN deposited using metal organic vapor-phase epitaxy (MOCVD).

Figure 2A:
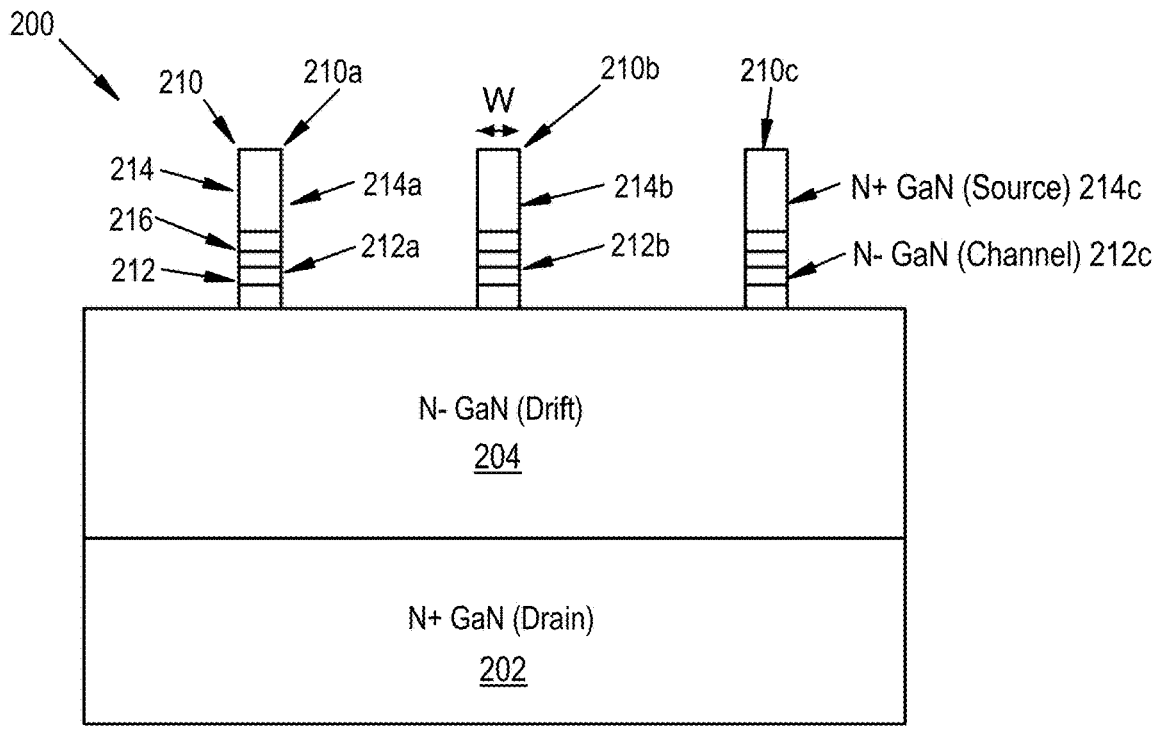
FIG. 2A is a side cross-sectional view of an optically controlled, wide band gap semiconductor power device, including one or more narrow band gap materials, such as quantum wells, embedded in a channel.

FIG. 2A is a side cross-sectional view of an optically controlled, wide band gap semiconductor power device 200, including a drift region 204 (which may be similar to or the same as drift region described above in conjunction with FIG. 1A) disposed over a drain region 202 (which may be similar to or the same as drain region described above in conjunction with FIG. 1A). One or more fin structures 210a-210c, generally denoted 210, are formed or otherwise comprise respective ones of nanostructured channel structures 212a-212c, generally denoted 212 (or more simply channels 212), and respective source structures 214a-214c, generally denoted 214 (or more simply sources 214), with the channels 212 disposed over (here directly on) the drift region 204 and the source 214 disposed over (here directly on) respective ones of the channel 212. Channels 212 comprise an optically active material. In embodiments, one or more channels 212 include a material 216, which allows for optical absorption with longer wavelengths. The material 216 may be a narrow band gap material or a material with net carrier type opposite to that of the source region and the drain region. The narrow band gap materials may be one or more quantum wells, for example a thin (e.g., less than 5 nm thick) layer of narrow band gap material. The narrow band gap materials may be a thicker (e.g., greater than 5 nm) layer of narrow band gap material.

The fin structures 210 each have a width W less than 1 μm, such that the channel is depleted from the direction perpendicular to the current flow. Accordingly, the channels 212 and sources 214 are nanostructured with a width less than 1 μm. The fin structures 210 may each have a width less than 500 nm. A first fin structure 210a includes a first channel 212a disposed over (and here directly on) the drift region 204 and a first source 214a disposed over (and here directly on) the first channel 212a. A second fin structure 210b includes a second channel 212b disposed over (and here directly on) the drift region 204 and a second source 214b disposed over (and here directly on) the second channel 212b. A third fin structure 210c includes a third channel 212c disposed over (and here directly on) the drift region 204 and a third source 214c disposed over (and here directly on) the third channel 212c. The channel 212 may be formed from a wide band gap material and may be lightly doped with an N type dopant. The source 214 may be formed from a wide band gap material and may be heavily doped with an N type dopant.

In embodiments, the material 216 may be a narrow band gap materials comprising a three-nitride material, such as indium gallium nitride (InGaN). InGaN absorbs wavelengths in the green-blue range, with the specific wavelength dependent on the indium composition. The use of InGaN enables triggering of the device 200 using longer wavelength optical signals. Furthermore, the presence of the narrow band gap materials 216 provide a way to effectively remove the generated holes via band-to-band recombination, thus, increasing the chance to achieve a higher current density in the device 200 (high meaning a current density between 10 A/cm$^2$-1000 A/cm$^2$). In an embodiment, the channel may be doped with a first dopant type and the narrow band gap material may have a second dopant type, opposite from the first dopant type. In said embodiment, the channel may not be formed as a nanostructure.

Figure 2B:
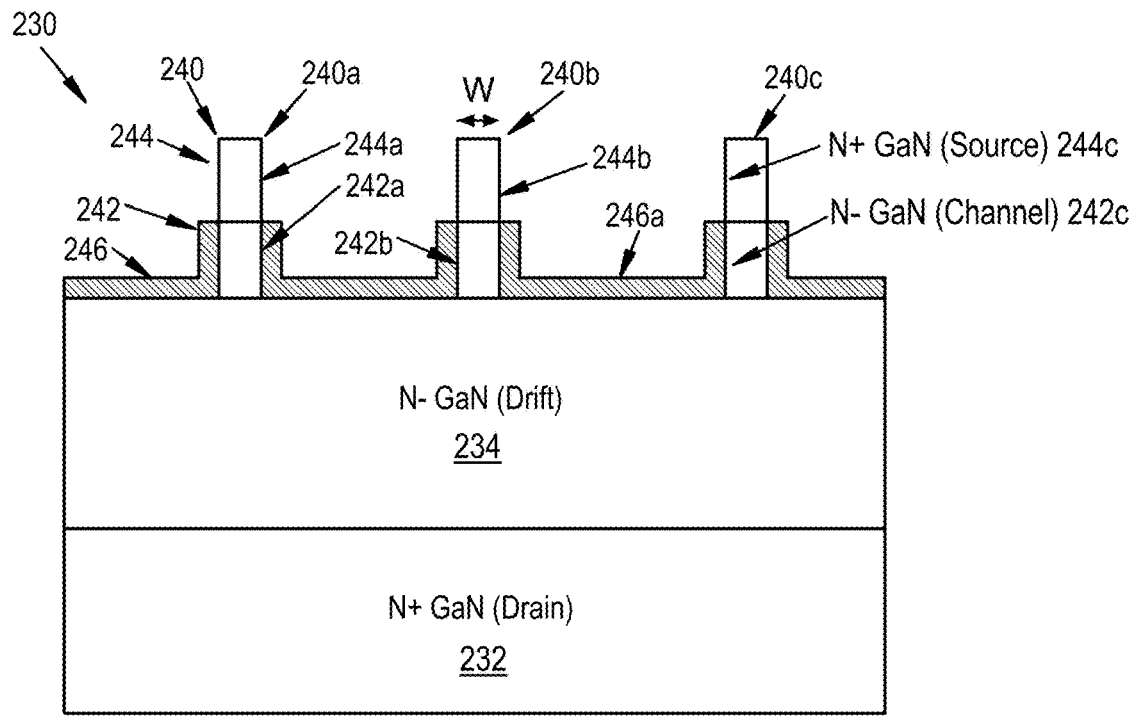
FIG. 2B is a side cross-sectional view of an optically controlled, wide band gap semiconductor power device, including a material layer disposed on the device.

FIG. 2B is a side cross-sectional view of an optically controlled, wide band gap semiconductor power device 230 including a drift region 234 (which may be similar to or the same as drift region described above in conjunction with FIG. 1A) disposed over a drain region 232 (which may be similar to or the same as drain region described above in conjunction with FIG. 1A). One or more fin structures 240a-240c, generally denoted 240, are formed or otherwise comprise respective ones of nanostructured channel structures 242a-242c, generally denoted 242 (or more simply channels 242), and respective source structures 244a-244c, generally denoted 244 (or more simply sources 244), with the channels 242 disposed over (here directly on) the drift region 234 and the sources 244 disposed over (here directly on) respective ones of the channels 242. Channels 242 comprise an optically active material. A narrow band gap absorber 246 is disposed over (here directly on) the drift region 234 and the channels 242. The narrow band gap absorber 246 may comprise one or more of organic molecules, colloidal quantum dots, two dimensional materials, group IV elements, or III-nitride alloys.

The fin structures 240 each have a width W less than 1 μm, such that the channel is depleted from the direction perpendicular to the current flow. The channels 242 and sources 244 are nanostructured with a width less than 1 μm. The fin structures 240 may each have a width less than 500 nm. A first fin structure 240a includes a first channel 242a disposed over (here directly on) the drift region 234 and a first source 244a disposed over (here directly on) the first channel 242a. A second fin structure 240b includes a second channel 242b disposed over (here directly on) the drift region 234 and a second source 244b disposed over (here directly on) the second channel 242b. A third fin structure 240c includes a third channel 242c disposed over (here directly on) the drift region 234 and a third source 244c disposed over (here directly on) the third channel 242c. The channels 242 may be formed from a wide band gap material and may be lightly doped with an N type dopant. The sources 244 may be formed from a wide band gap material and may be heavily doped with an N type dopant.

FIGS. 2A-2B disclose example embodiment of optically controlled, wide band gap semiconductor power devices 200, 230. Processing methods (processing methods referring to the quantum wells disclosed in FIG. 2A and the material layer disclosed in FIG. 2B) may be incorporated to increase the device triggering wavelength. In order to turn on the devices 200, 230, the optical signal preferably provides enough energy to promote band-to-band transition in the semiconductor material. For example, for an optically controlled GaN power device without other optically active structures (such as fin structures 210), the triggering wavelength should preferably be in the ultraviolet (UV) range (meaning less than 365 nm). However, it may be difficult to achieve high-power generation and coupling of light in such wavelengths. Devices 200, 230 can be adapted, for example by the processing methods, to increase the triggering wavelength and increase (and ideally maximize) the current density in the device.

Figure 2C:
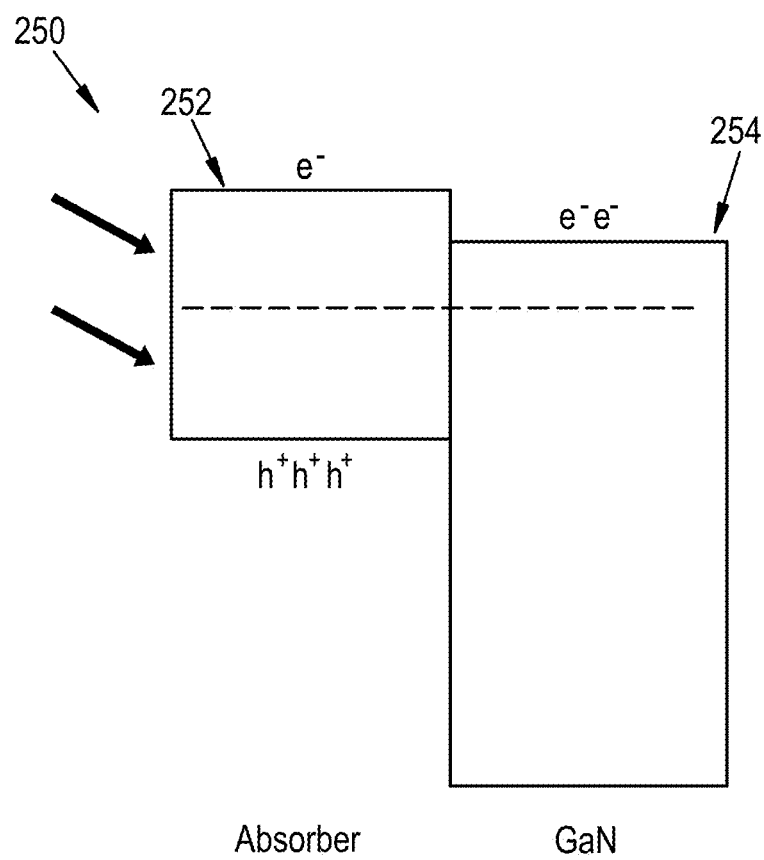
FIG. 2C is a is a band diagram of a device including a material layer and a channel.

FIG. 2C is a band diagram 250 of a material layer 252 (which may be similar to or the same as the narrow band gap absorber 246 described above in conjunction with FIG. 2B) and a channel 254 (which may be similar to or the same as the channels 242 described above in conjunction with FIG. 2B), which demonstrates the carrier transport of the material layer 256 and the channel 254. The material layer 252 is a narrow band gap absorber and forms a type-II band alignment with the channel 254, which favors electron transport. By ensuring type II band alignment between the absorber and GaN channel, optically generated electrons in the absorber will migrate into the GaN channel, while holes will remain in the absorber.

Figure 3A:
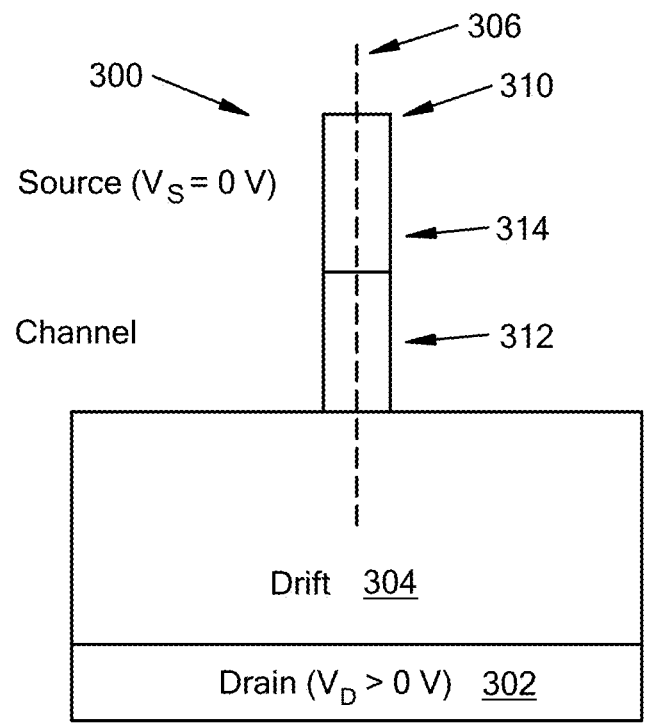
FIG. 3A is a side cross-sectional view of an optically controlled, wide band gap semiconductor power device in an off state.

FIGS. 3A-3D disclose the operation mechanism of an optically controlled vertical GaN fin transistor, such as the device 100, 130, 150, 200, 230. FIG. 3A is a side cross-sectional view of an optically controlled, wide band gap semiconductor power device 300 in the off state (without illumination) (such as the off state described above in relation to FIG. 1A). The device 300 includes a drift region 304 (which may be similar to or the same as drift region described above in conjunction with FIG. 1A) disposed over a drain region 302 (which may be similar to or the same as drain region described above in conjunction with FIG. 1A). A fin structure 310 is formed or otherwise comprise respective ones of a nanostructured channel structure 312 and a source structure 314, with the channel structure 312 disposed over (here directly on) the drift region 304 and the source structure 314 disposed over (here directly on) the channel structure 312. A cutline 306 forms a cross section along the fin structure 310 and the drift region 304.

Figure 3B:
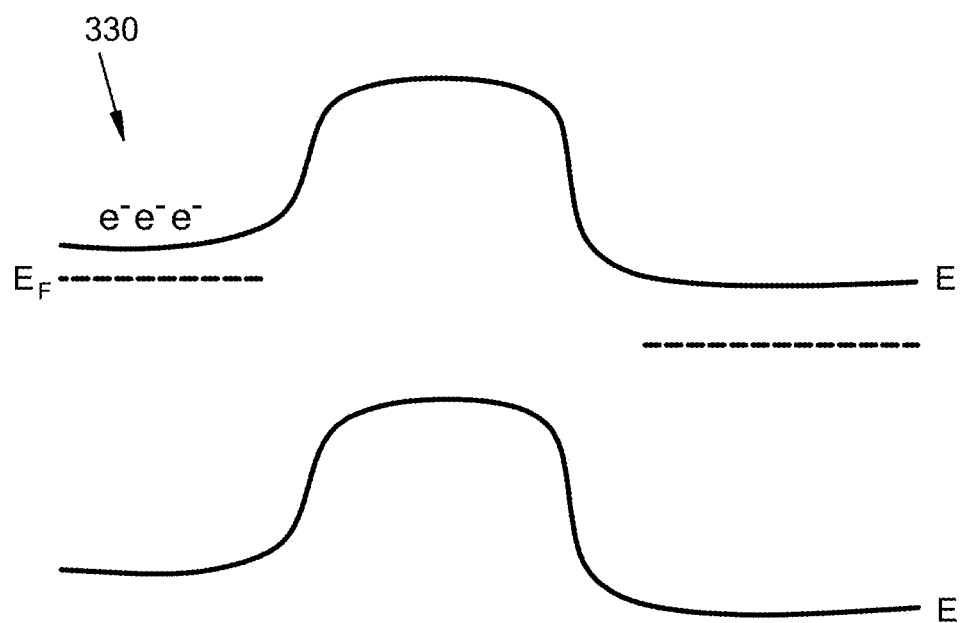
FIG. 3B is a band diagram of the device of FIG. 3A.

FIG. 3B is a band diagram 330 of the device 300 along the cutline 306. In the off state, the channel structure 312 is depleted by a lateral electric field. The large energy barrier in the depleted channel structure 312 blocks electrons moving from the source structure 314 to the drain region 302. The electrons in the source structure 314 will be blocked by the potential barrier of the channel structure 312.

Figure 3C:
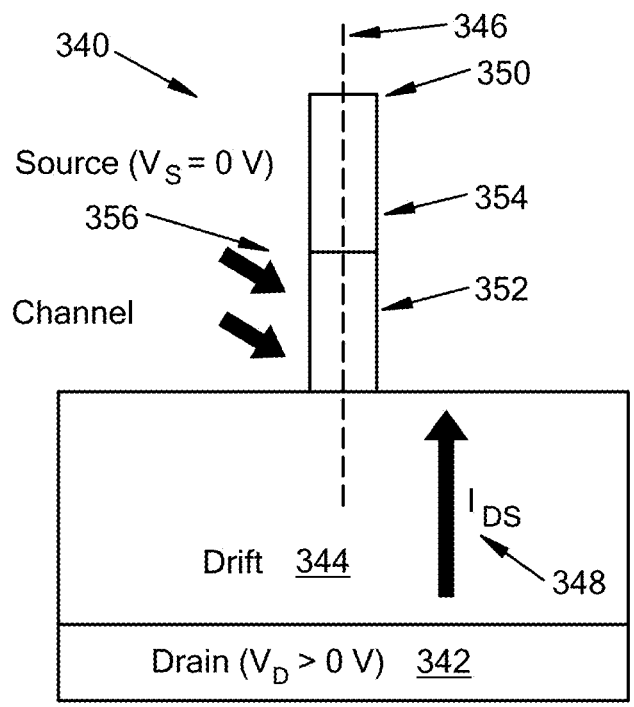
FIG. 3C is a side cross-sectional view of an optically controlled, wide band gap semiconductor power device in an illuminated state.

FIG. 3C is a side cross-sectional view of an optically controlled, wide band gap semiconductor power device 340 in the on state (with illumination) (such as the on state described above in relation to FIG. 1A). The device 340 includes a drift region 344 (which may be similar to or the same as drift region described above in conjunction with FIG. 1A) disposed over a drain region 342 (which may be similar to or the same as drain region described above in conjunction with FIG. 1A). A fin structure 350 is formed or otherwise comprise respective ones of a nanostructured channel structure 352 and a source structure 354, with the channel structure 352 disposed over (here directly on) the drift region 344 and the source structure 354 disposed over (here directly on) the channel structure 352. A cutline 346 forms a cross section along the fin structure 350 and the drift region 304. The illumination 356 is disposed adjacent to the fin structure 350 (demonstrated by arrow 348).

Figure 3D:
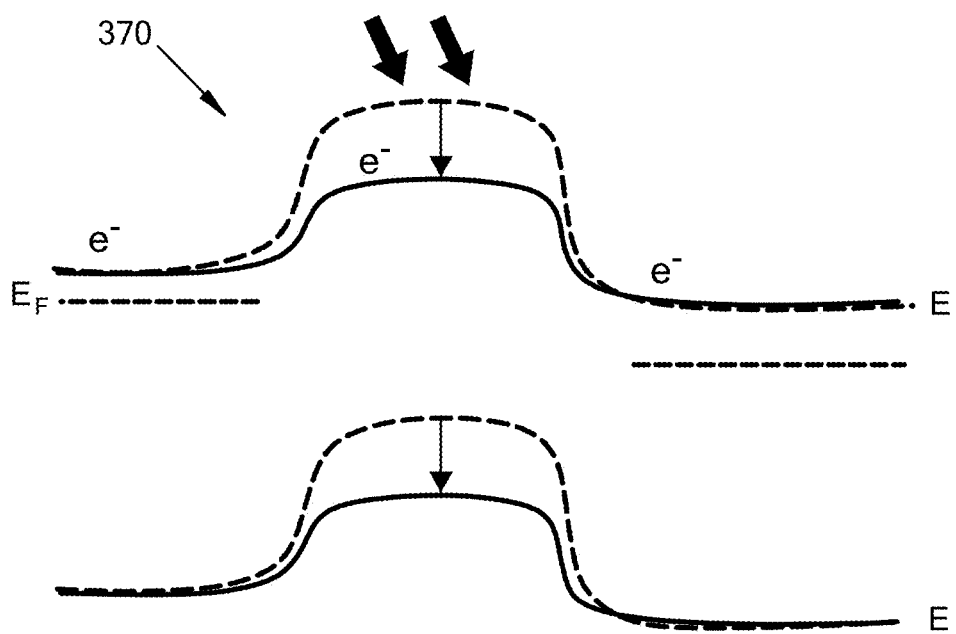
FIG. 3D is a band diagram of the device of FIG. 3C.

FIG. 3D is a band diagram 370 of the device 340 along the cutline 346. As the channel structure 352 is illuminated 356, electron concentration in the channel structure 352 increases, causing potential barrier to lower and the source electrons will be able to reach the drain in the presence of a vertical field. The optically generated carriers lower the energy barrier in the channel structure 352, causing current to flow between the source structure 354 and drain region 342.

With a large enough vertical field, the photoconductive gain will increase due to lower carrier transit time. Optical gain is further enhanced by the lateral field across the fin. For a UV-controlled device, due to local separation of optically generated electrons and holes, the effective carrier lifetime increases and the holes act as an additional photogate to enhance the device on-current.

Figure 4A:
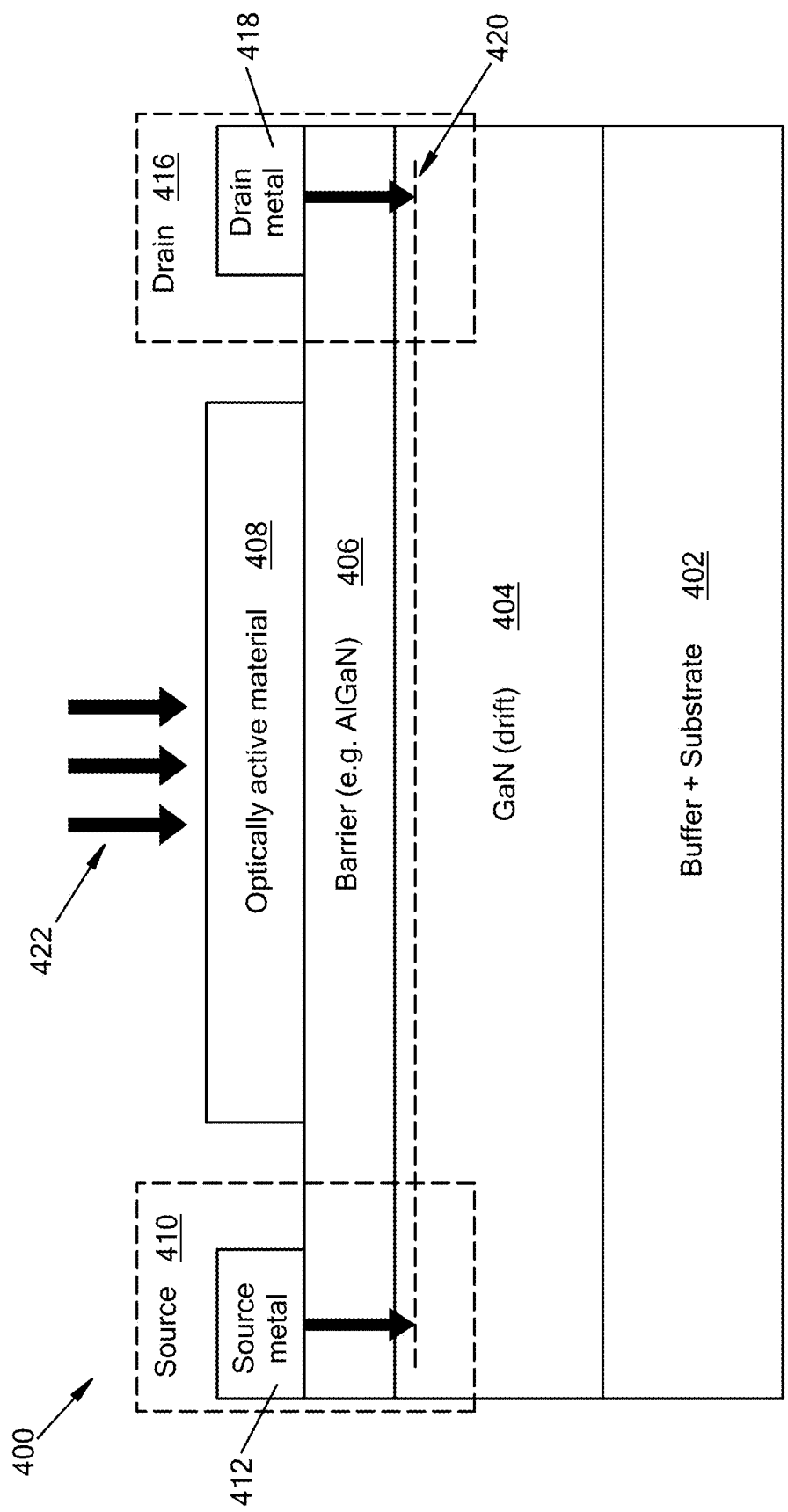
FIG. 4A is a side cross-sectional view of a fin transistor, with an absorber disposed on the transistor.

FIG. 4A is a side cross-sectional view of a semiconductor power device 400, including a drift region 404 is disposed over (here directly on) a buffer and substrate 402. The buffer and substrate 402 may be formed from GaN. The drift region 404 comprises a wide band gap material (e.g., a material with a band gap greater than 2 eV), the wide band gap material comprises one or more of: gallium nitride (GaN), aluminum gallium nitride ($Al_xGa_yN$, x+y=1), aluminum nitride (AlN), boron aluminum nitride ($B_xA_yN$, x+y=1), gallium oxide ($Ga_2O_3$), silicon carbide (SiC), diamond, or boron nitride (BN). A barrier region 406 is disposed over (here directly on) the drift region 404. The barrier region 406 is formed from any of the wide band gap materials described herein, including, but not limited to, aluminum gallium nitride (AlGaN). One or more channels 420 are formed at an interface of the barrier region 406 and the drift region 404 from electron/hole gas at the interface of the barrier region 406 and the drift region 404 (e.g. a 2 dimensional electron gas (2DEG) interface). The channels 420 may be nanostructured.

A source metal (or source contact) 412 is disposed on a first surface of the barrier region 406. The source metal 412 forms a source region 410 in electrical communication with at least some of the one or more channels 420. The first surface may be the top surface of the barrier region 406 or a side surface of the barrier region 406. It is enough if the source metal 412 physically contacts the barrier region 406, typically this is from the top or the side. A drain metal (or drain contact) 418 is disposed adjacent to the source region 410 on the first surface of the barrier region 406. The drain metal 418 forms a drain region 416 in electrical communication with at least some of the one or more the channels 420.

An optically active material 408 is disposed on the first surface of the barrier region 406 between the source metal 412 and the drain metal 418. The optically active material 408 generates charge carriers in response to an optical signal. In the on state (i.e., with the device 400 biased (or activated) into its conductive or low resistance state by a direct optical signal, which is denoted by arrows 422 in FIG. 4A), charge carriers in the channels 420 conduct a current in the device 400 when an electric field is applied across the source region 410 and the drain region 416, causing current to substantially flow through at least some of the one or more channels 420 directly between the source region 410 and the drain region 416. In an off state (i.e. with no optical signal impinging on the device 400), charge carriers in the channels 420 are depleted, turning off the device 400.

The optically active material 408 may comprise narrow band gap absorbers or p-type nitride materials (e.g., GaN, AlGaN, InGaN). Such narrow band gap absorbers include but are not limited to organic molecules (Poly(3-hexylthiophene-2,5-diyl) (P3HT), PV2001, copper phthalocyanine (CuPc), Pentacene, Poly(9,9-dioctylfluorene-alt-N-(4-sec-butylphenyl)-diphenylamine) (TFB), 4,4'-Bis(N-carbazolyl)-1,1'-biphenyl (CBP)), colloidal quantum dots (e.g., copper oxide ($Cu_2O$), zinc telluride (ZnTe)), two-dimensional materials (e.g., molybdenum disulfide ($MoS_2$), tungsten diselenide ($WSe_2$)), group IV elements, or III-nitride alloys. In an example embodiment, the optically active material 408 has a net carrier type opposite to the net electrical carrier type of the channels 420. For example, the optically active material 408 may be GaN doped with a p-type dopant. When the optically active material 408 is a narrow band gap absorber, it forms a type-II band alignment with the channel (e.g., GaN) to allow unipolar carrier transport in the channels 420.

The device 400 may have a simpler fabrication process compared to device 100. A vertical fin transistor calls for a multitude of masking and etching steps in order to fabricate the vertical structures that form the device 100. In comparison, to form a lateral fin transistor, less masking and etching steps are called for. For example, a lateral fin transistor may call for four to five masking steps, while a vertical fin transistor may call for eight to ten masking steps.

Figure 4B:
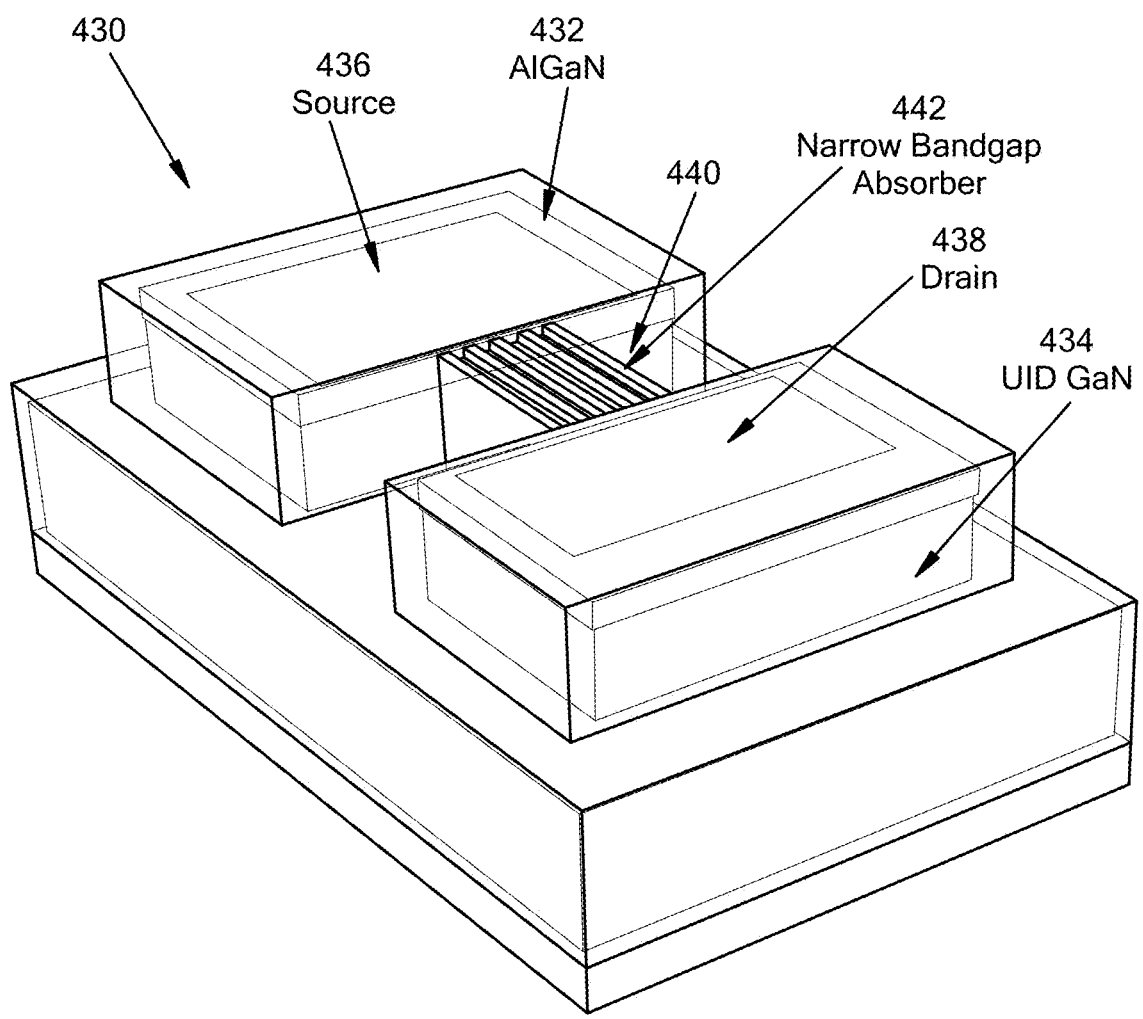
FIG. 4B is a perspective view of an optically controlled, wide band gap semiconductor power device including one or more lateral fin channels.

FIG. 4B is a perspective view of an optically controlled, wide band gap semiconductor power device 430 including one or more fin channels 440 (the fin channels 440 may be similar to or the same as the channels 420 described above in conjunction with FIG. 4A). Instead of an electrical gate, an optical gate is used to both deplete the fin channels 440 in the off state and activate the channels of the fin channels 440 upon illumination.

A AlGaN layer 432 (which may be similar to or the same as the barrier region 406 described above in conjunction with FIG. 4A) is disposed over (here directly on) a UID GaN layer 434 (which may be similar to or the same as the drift region 404 described above in conjunction with FIG. 4A). A source metal 436 (which may be similar to or the same as the source metal 412 described above in conjunction with FIG. 4A) is disposed opposite a drain metal 438 (which may be similar to or the same as the drain metal 418 described above in conjunction with FIG. 4A) over (here directly on) the AlGaN layer 432. A narrow band gap absorber 442 (which may be similar or the same as the optically active material 408 described above in conjunction with FIG. 4A) is disposed over (here directly on) the fin channels 440. The narrow band gap absorber 442 comprises one or more of organic molecules, colloidal quantum dots, two dimensional materials, group IV elements, or III-nitride alloys. The narrow band gap absorber 442 may be disposed underneath the fin channels 440.

In the off state, voltage is blocked between source metal 436 and drain metal 438 due to channel depletion. Upon illumination (meaning the device is in the on state), electron-hole pairs are generated in the optical absorber surrounding the fin channels 440. Due to type-II band-alignment, electrons will move towards the nitride channel, which leads to increase in current (IDS).

Figure 5A:
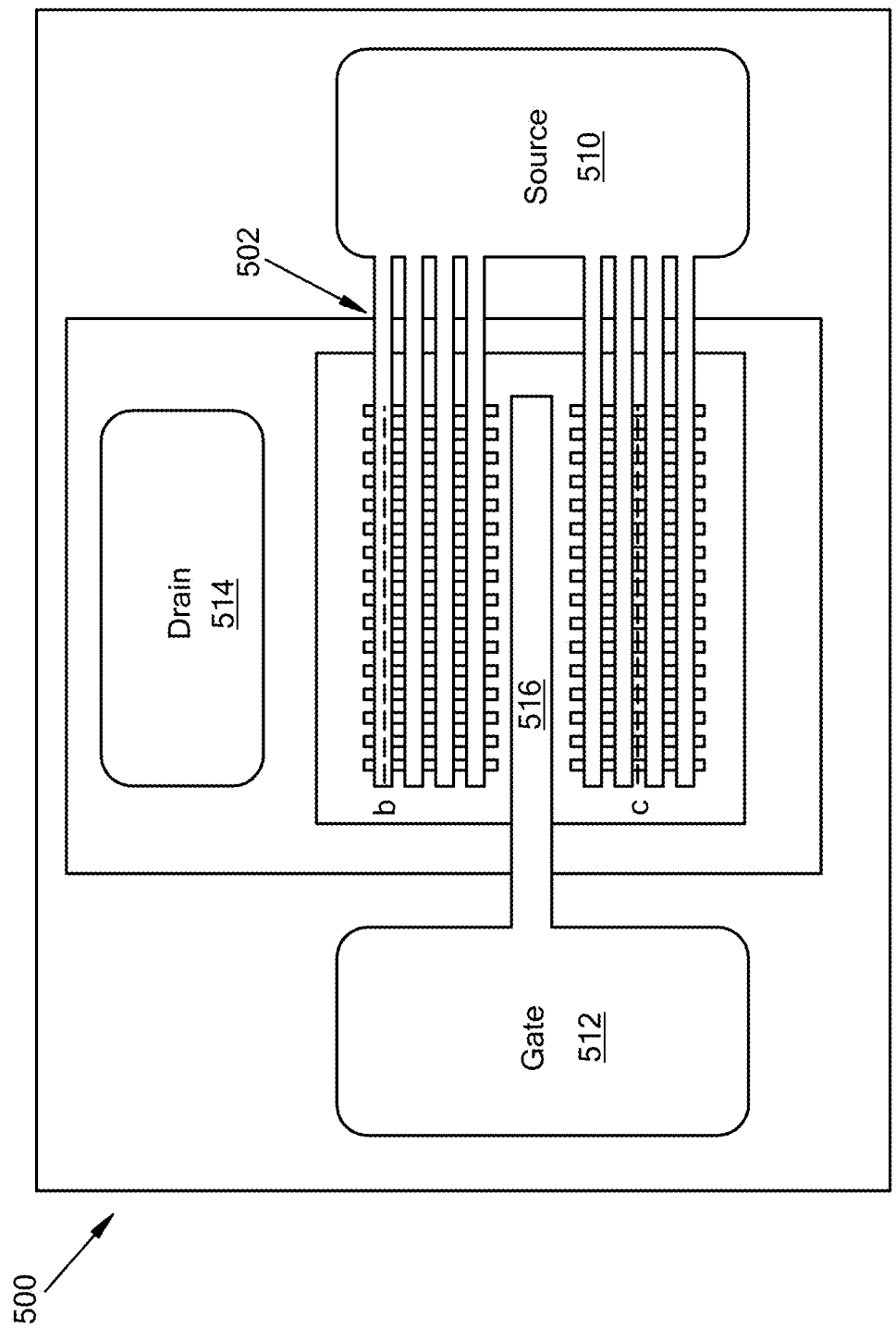
FIG. 5A is a top view of a device layout.

FIG. 5A is a top view of a layout 500 for an interdigitated probe pad including one or more fin transistors 502. The layout 500 includes a source structure 510 disposed across from a gate structure 512. A drain structure 514 is positioned on an opposing side from the source structure 510 and gate structure 512. The fin transistors 502 are electrically connected to the source structure 510. These fin transistors 502 are gated from the sidewall and have an optically transparent window to receive the optical signal and allow the optically active material to generate charge carriers in the channel between the interdigitated source pad fingers. The interdigitated pad structure allows maximum optical transmission with the possibility of diffraction effects that help increase the divergence angle of optical signal, which leads to an increased amount of light that gets absorbed from the depleted fin transistors from the side.

The center array may comprise one or more dummy fin structures 516 that provide contact with gate structure 512. The dummy fin structures 516 are electrically disconnected from the source structure 510. Therefore, the dummy fin structures 516 are not electrically active (e.g., they do not contribute to current). In some embodiments, the dummy fin structures 516 may not be present.

In order to maximize optical modulation of the device conductivity, optical absorption, and generation should preferably take place in the fin transistors 502. However, for a vertical device, such as layout 500, the source structure 510 is placed at the top of the fin transistors 502, in order to provide electrical contact to the source structure 510 while allowing for optical absorption. Part of the fin transistors 502 may be covered with a non-transparent material to provide sufficient electrical contact. Along the same fin transistors 502 there are one or more optically transparent windows (which may be referred to herein as spacers) between the probe pad fingers to receive the optical signal and allow the optically active material to generate charge carriers in the channel. As an example, UV-transparent $SiO_2$ is used as the spacer between fin transistors 502. The optically transparent windows receive optical signal and allow the optically active material to generate charge carriers in the channel. The interdigitated pad structure allows maximum optical transmission with the possibility of diffraction effects that help increase the divergence angle of optical signal, which leads to an increased amount of light that gets absorbed from the depleted fin transistors 502 from the side.

Figure 5B:
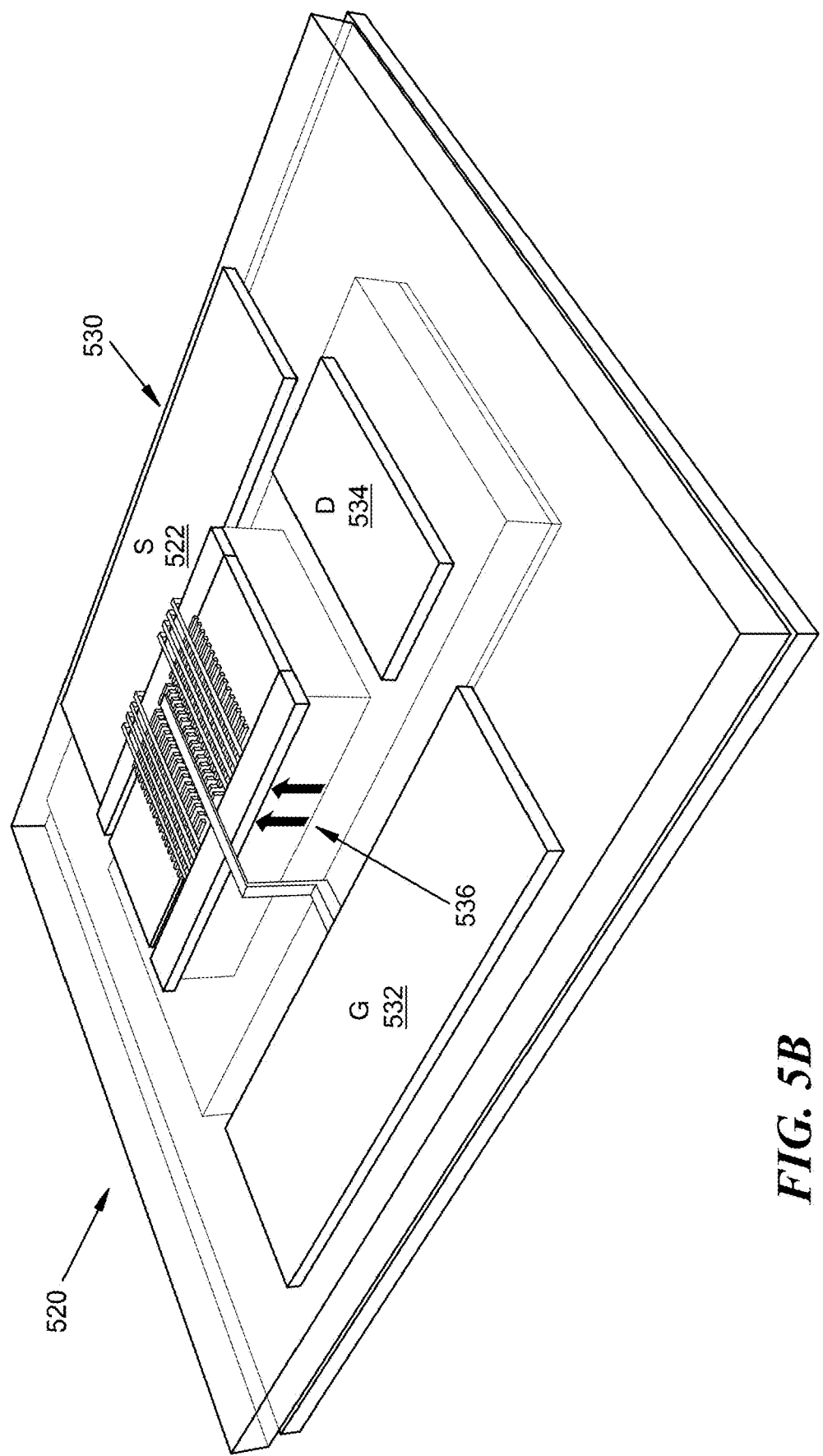
FIG. 5B is a perspective view of a device layout.

FIG. 5B is a perspective view of a layout 520 including one or more fin transistors 522. Layout 520 includes a source structure 530 disposed across from a gate structure 532. A drain structure 534 is positioned on an opposing side between the source structure 530 and gate structure 532. The fin transistors 522 are electrically connected to the source structure 530. Current flows vertically, as indicated by arrows 536. The layout 520 is a three-terminal device, where the fin depletion can be further enhanced by applying a negative voltage to the isolated gate structure 532.

FIGS. 6A-6K are side cross-sectional views of an example of a device 600 during fabrication. For example, the process may be used for a quasi-vertical GaN fin device that is optically controlled, such as the device 130 disclosed in FIG. 1C. FIGS. 6A-6K illustrate an example embodiment of multiple additive and subtractive semiconductor processing techniques which may be used to form the device, however other semiconductor processing techniques may be used.

Quasi-vertical refers to a device that includes an insulating substrate (e.g., a sapphire, engineered substrate with an insulating buffer), accordingly the drain is accessible from the top of the device. These substrates are significantly cheaper than the conductive bulk GaN that is used to make fully vertical devices (whose drain contact is located at the bottom of the substrate).

A fully-vertical Gallium Nitride (GaN) fin device refers to a device that includes a conductive substrate (e.g., a n+ bulk GaN), wherein the drain can be accessed from the bottom of the device. The fabrication process for a fully-vertical Gallium Nitride (GaN) fin device may be similar to the fabrication of device 600 shown in FIG. 6A-K.

Figure 6A:
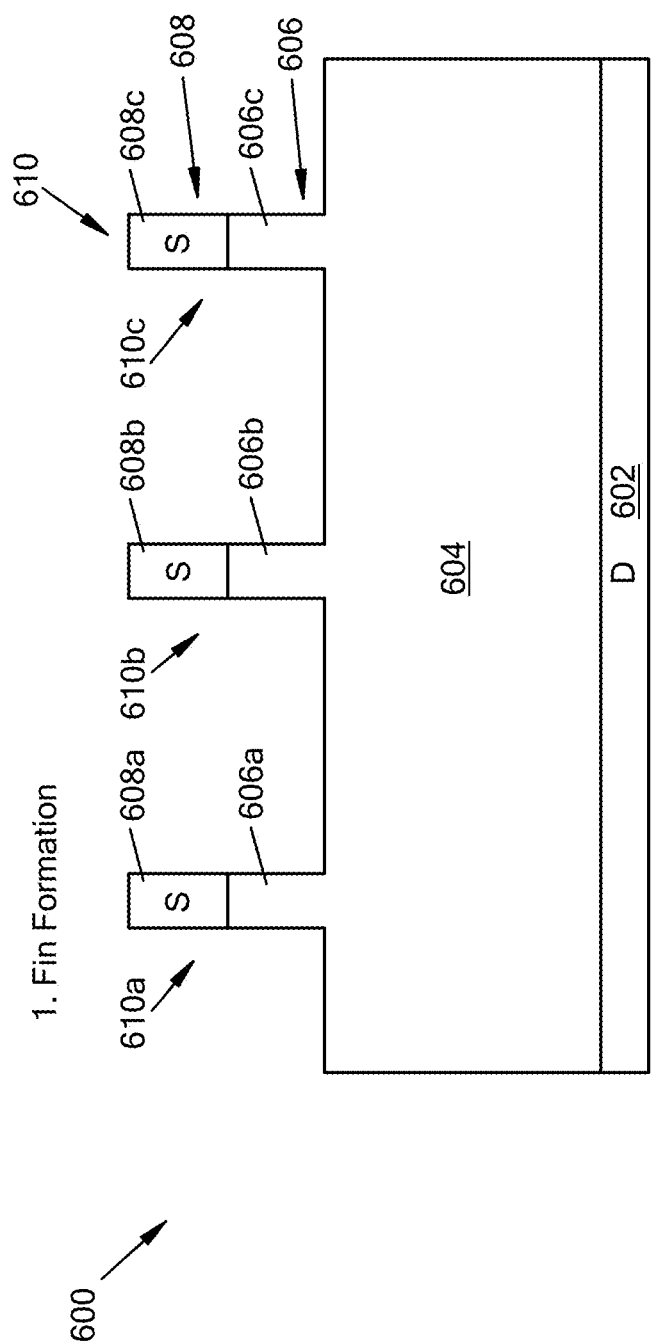
FIG. 6A-6K are side cross-sectional views of an example of an optically controlled, wide band gap semiconductor power device during fabrication.

Referring to FIG. 6A, one or more fin structures 610a-610c, generally denoted 610 (or more simply fin structures 610), are formed in the device 600. A drift region 604 (which may be similar to or the same as drift region described above in conjunction with FIG. 1A) is disposed over (here directly on) a drain region 602 (which may be similar to or the same as drain region described above in conjunction with FIG. 1A). One or more fin structures 610a-610c, generally denoted 610, are formed or otherwise comprise respective ones of nanostructured channel structures 606a-606c, generally denoted 606 (or more simply channels 606), and respective source structures 608a-608c, generally denoted 608 (or more simply sources 608), with the channels 606 disposed over (here directly on) the drift region 604 and the sources 608 disposed over (here directly on) respective ones of the channels 606.

A first fin structure 610a includes a first channel 606a disposed over (here directly on) the drift region 604 and a first source 608a disposed over (here directly on) the first channel 606a. A second fin structure 610b includes a second channel 606bb disposed over (here directly on) the drift region 604 and a second source 608b disposed over (here directly on) the second channel 606b. A third fin structure 610c includes a third channel 606c disposed over (here directly on) the drift region 604 and a third source 608c disposed over (here directly on) the third channel 606c.

The fin structures 610 may be formed through lithography, to define sub-micron fin structures 610. The fin structures 610 are formed by dry etching with a chlorine-based chemistry. The fin structures 610 are oriented in such a way that the sidewall is exposed to the m-plane. Hot (hot referring to temperatures greater than 80° C.) tetramethylammonium hydroxide (TMAH) is used to smoothen the respective fin structure sidewall, as the hot TMAH etches in the a-plane more efficiently compared to that of the m-plane.

Figure 6B:
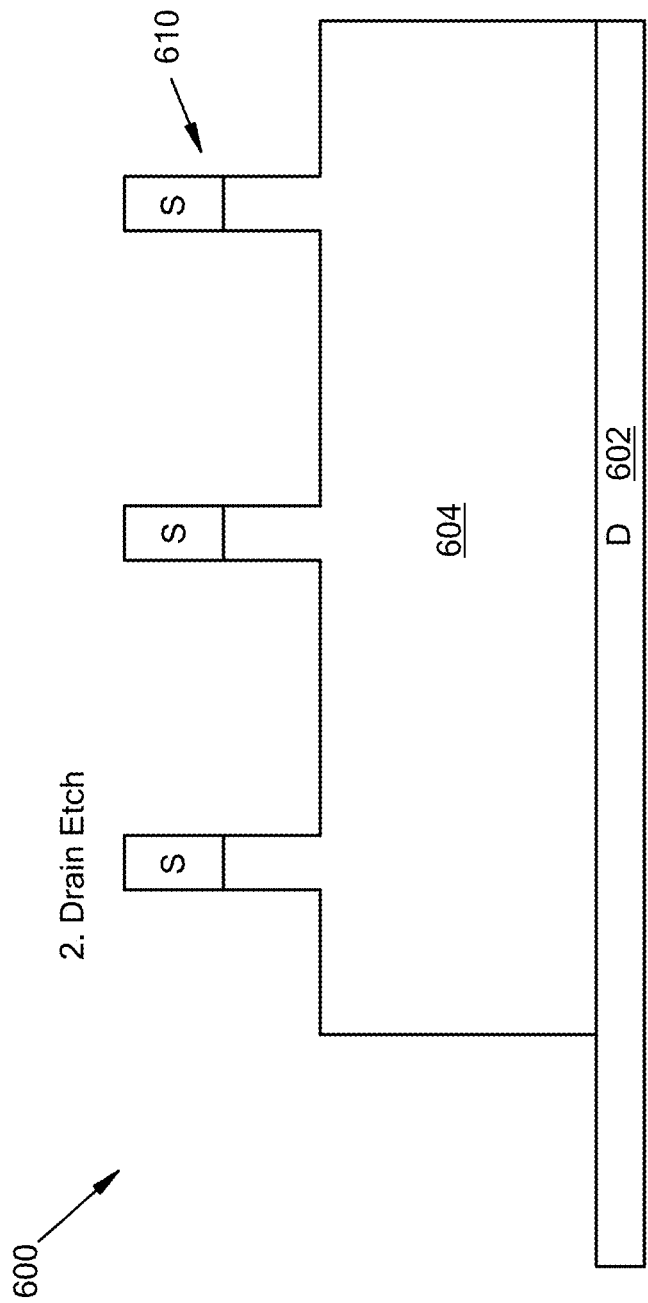

Referring to FIG. 6B, the drain region 602 in the device 600 is etched. Lithography is used to define the drain region 602. The drain region 602 is exposed after dry etching.

Figure 6C:
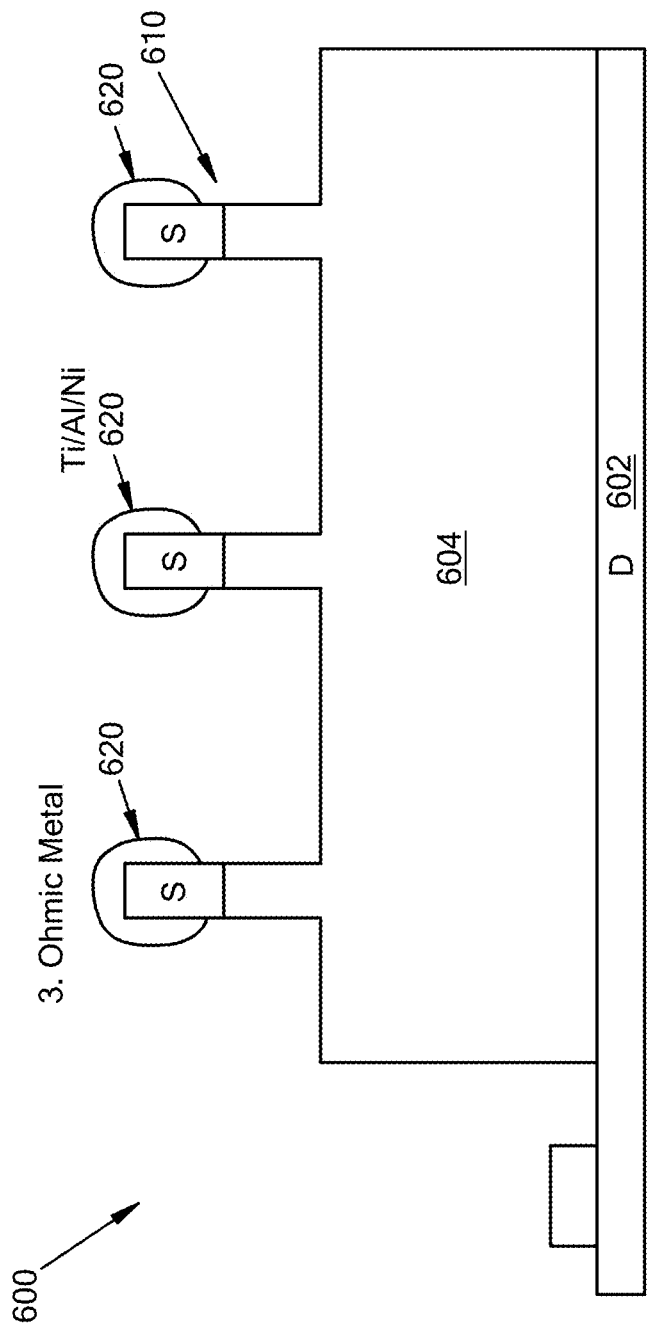

Referring to FIG. 6C, ohmic metal 620 is formed on the fin structures 610. The ohmic metal 620 may be a stack of titanium/aluminum/nickel (Ti/Al/Ni). Electron beam (ebeam) evaporation of a titanium/aluminum/nickel (Ti/Al/Ni) stack may be used to form the ohmic metal. In order to decrease (and ideally minimize) contact resistance, the contact area between the sources 608 of the respective fin structures 610 and the metal may be increased (and ideally maximized). To increase (and ideally maximize) the source contact area, the ohmic metal 620 is wrapped around the sources 608 on each respective fin structures 610 by using two tilted ebeam depositions from each side of the respective fin structure. The sample is tilted to an angle such that the neighboring fin structures 610 will shadow the channels 606, leaving only the top part (source) of the fin structures 610 covered with metal. The tilt angle can be calculated from the fin structure spacing, fin structure height, source thickness, and metal thickness.

Figure 6D:
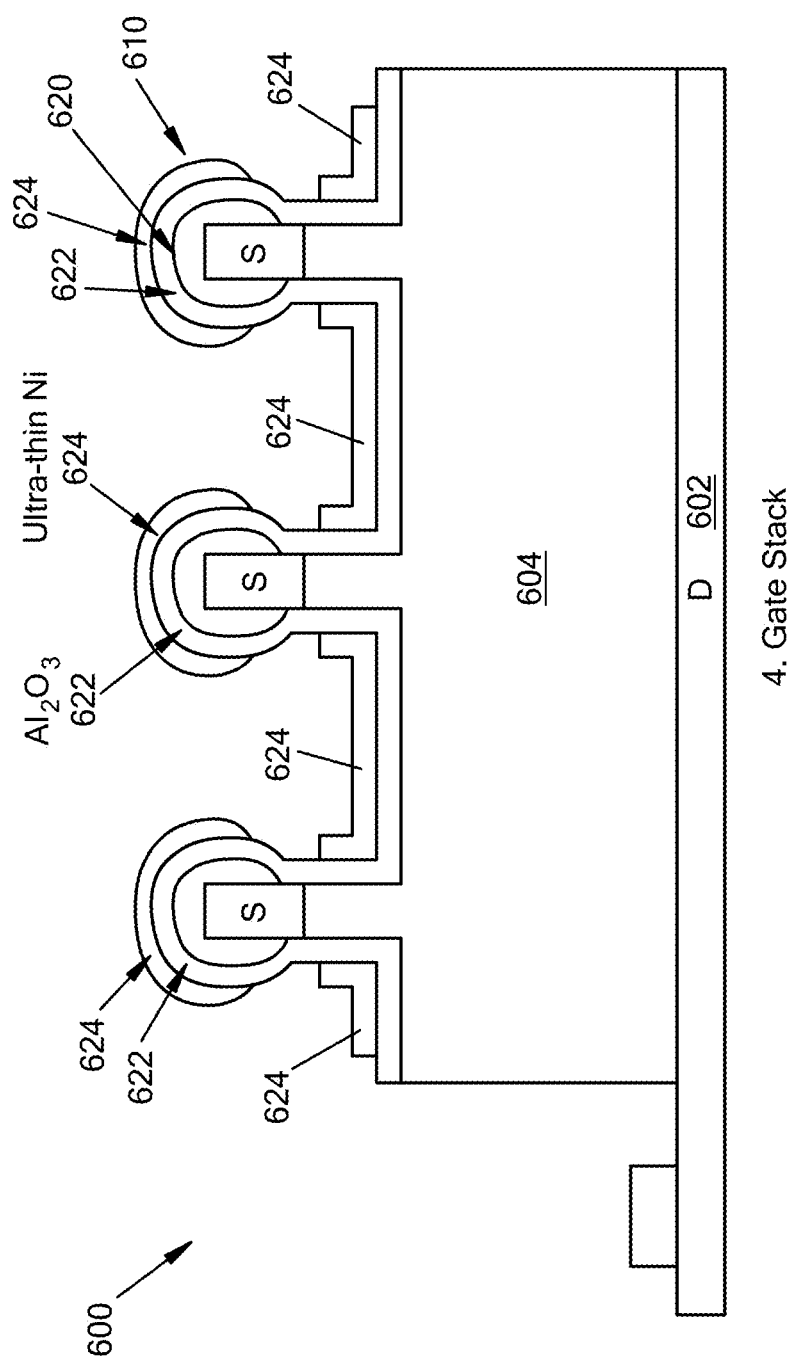

Referring to FIG. 6D, the gate stack, formed from a gate oxide 622 and a gate metal 624, is disposed over (here directly on) the device 600. The gate oxide 622, which may comprise aluminum oxide ($Al_2O_3$), is deposited with atomic layer deposition (ALD). Followed by two tilted ebeam gate metal evaporations from each side of the respective fin structures 610 (which may include an ebeam evaporation similar to or the same as the ebeam evaporation used to form the ohmic metal 620 in FIG. 6C), and one ebeam evaporation normal to the sample. The third deposition ensures the sidewall metal on each respective fin structure is electrically connected.

A gate metal 624 is disposed over (here directly on) the gate oxide 622. The ohmic metal 620 deposited in FIG. 6C maybe used to shadow the gate metal 624. A high work function metal, such as nickel (Ni), molybdenum (Mo), or platinum (Pt) may be used as the gate metal 624. The gate metal 624 deposited is thin (thin meaning less than 10 nm). Accordingly, the gate metal 624 is semi-transparent and allows partial light transmission into the depleted fin channels of the fin structures 610.

Figure 6E:
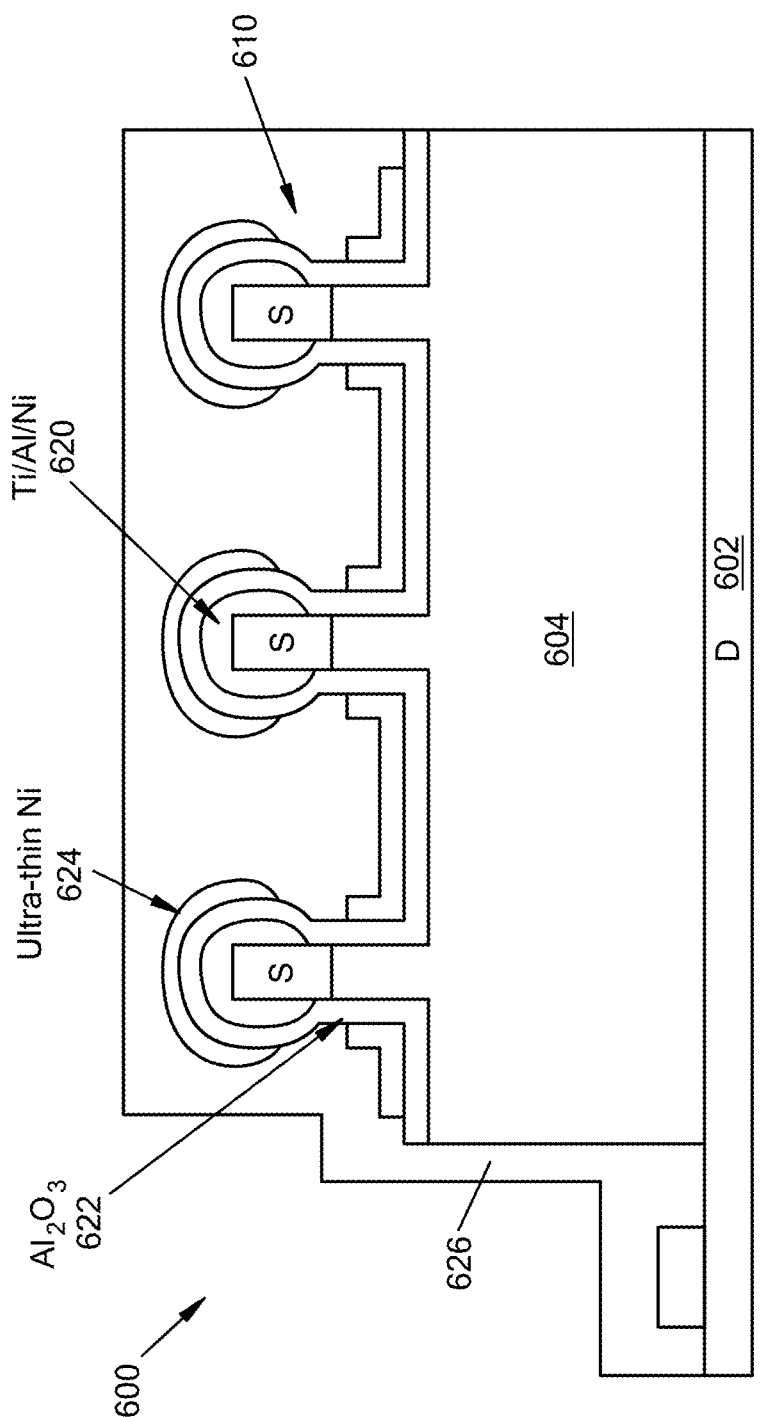

Referring to FIG. 6E, a gate spacer 626 is deposited over (here directly on) the device 600. A near ultra-violet (NUV) transparent, conformal silicon dioxide layer with tetraethyl orthosilicate (TEOS) as the precursor is deposited by plasma-enhanced chemical vapor deposition (PECVD) to form the gate spacer 626 between each respective fin structure. This may be used to planarize the channels 606.

Figure 6F:
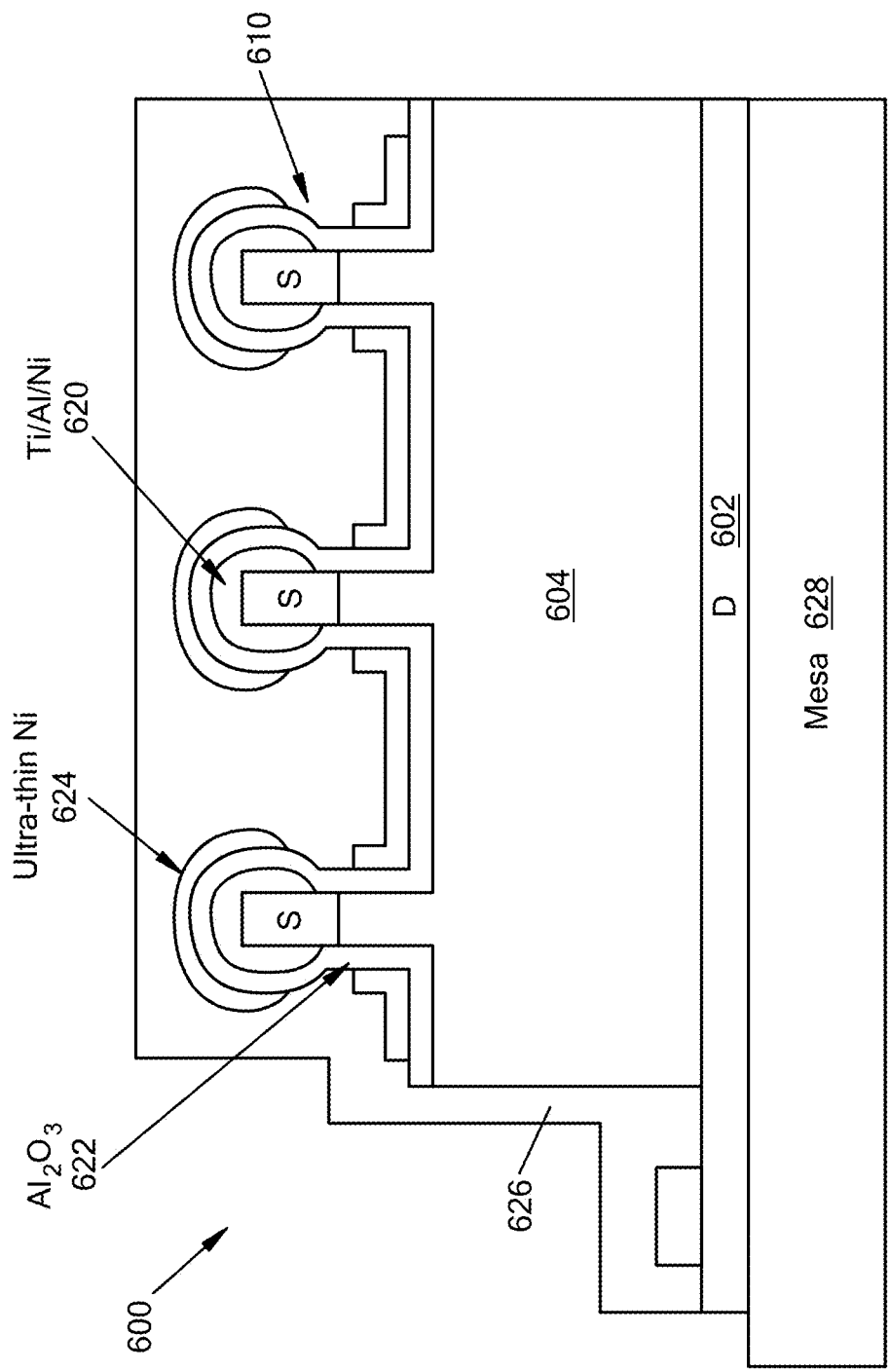

Referring to FIG. 6F, a mesa 628 is defined to electrically isolate the device 600. In the case of a fully-vertical Gallium Nitride (GaN) fin device, the drain etch disclosed in FIG. 6B and the mesa etch disclosed in FIG. 6F may be omitted.

Figure 6G:
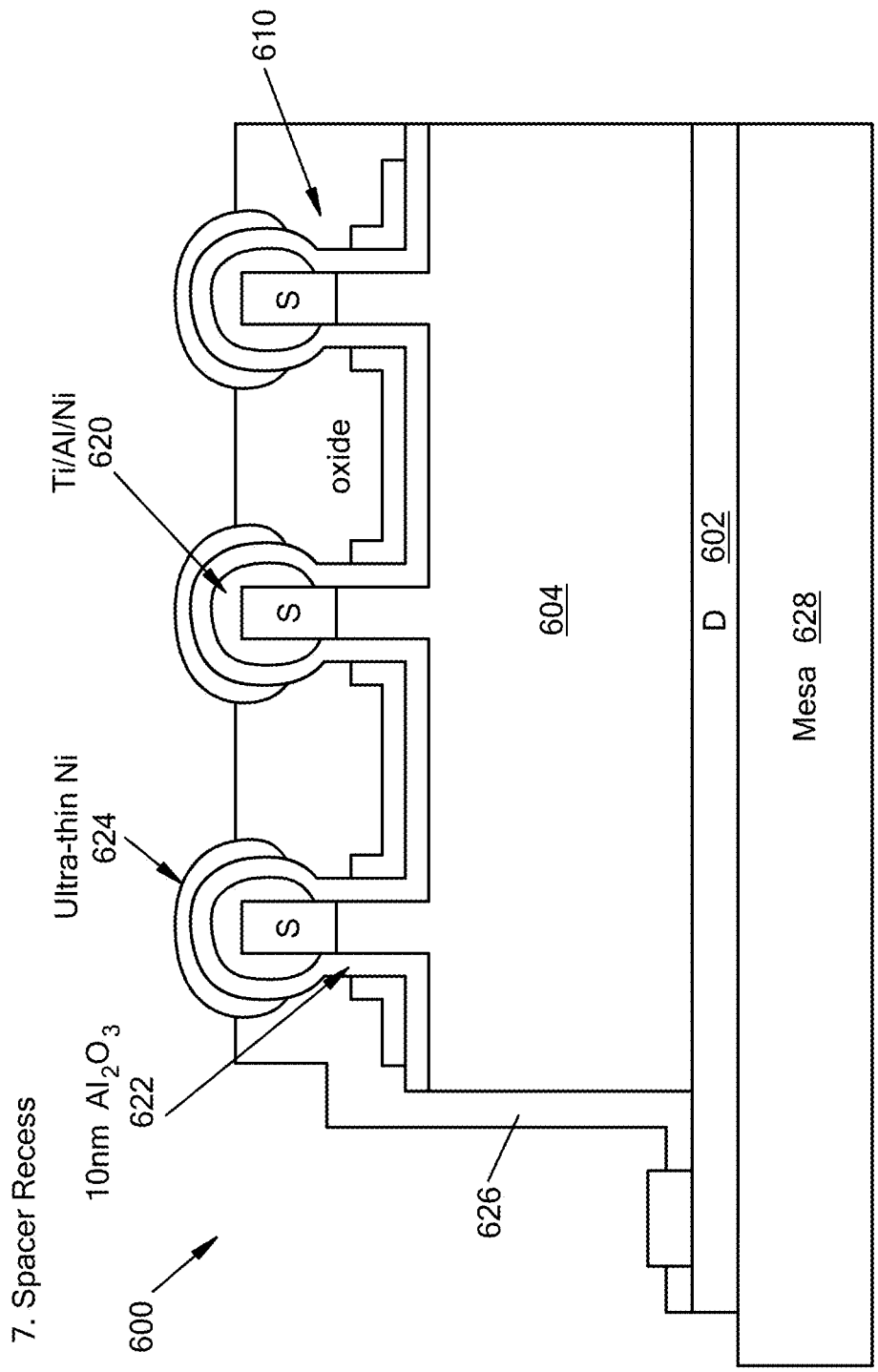
Figure 6H:
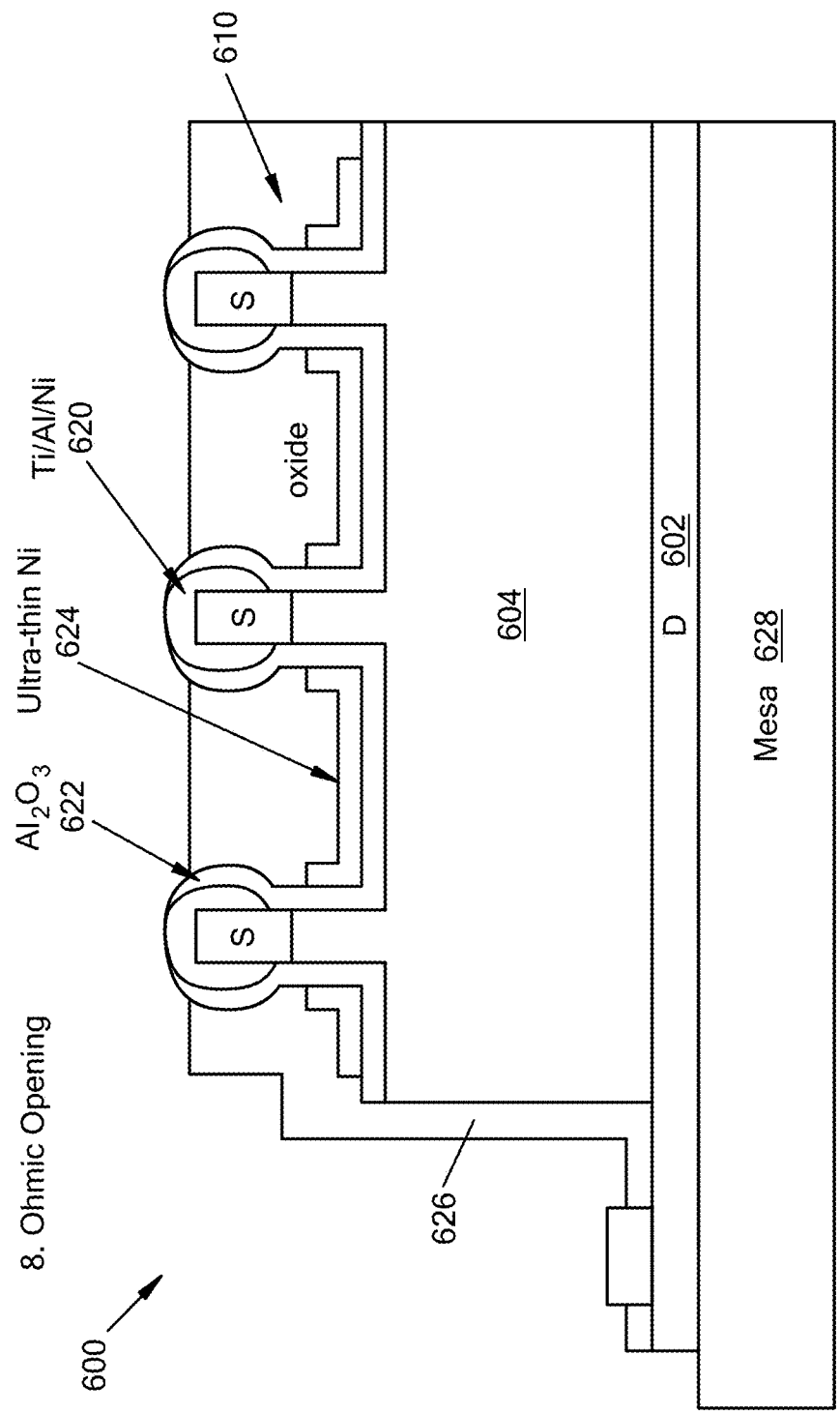

Referring to FIG. 6G, the gate spacer 626, or planarization oxide, is recessed to expose the top part of the gate stack. The gate spacer 626 may be recessed through an etch Referring to FIG. 6H, the gate stack is selectively removed from the device 600 to form an ohmic opening. Accordingly, a portion of the gate metal 624 and the gate oxide 622 formed on the fin structures 610 is removed. The gate stack is selectively removed by both wet etching (of the Ni) and dry etching (of the gate oxide) to access the ohmic metal 620.

Figure 6I:
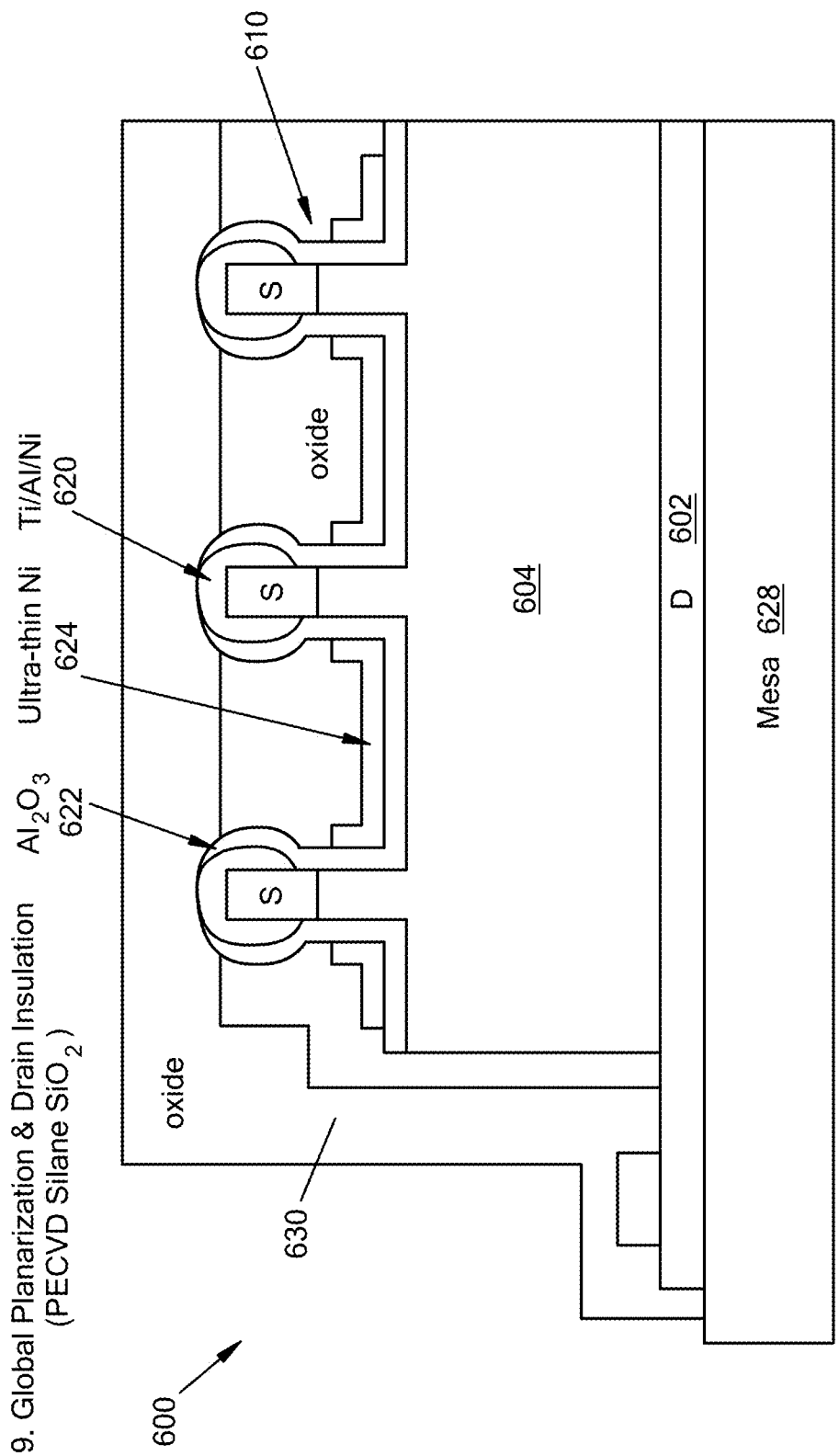

Referring to FIG. 6I, a layer of oxide 630 is deposited on the device 600. The oxide 630 may be silicon dioxide ($SiO_2$). The oxide 630 provides insulation on the edge of the device 600. In an embodiment, where the interdigitated source probe pad calls for a probe-landing area, therefore a metal layer (such as titanium/aluminum (Ti/Al) metal) may be extended to the mesa region. Accordingly, the global planarization layer electrically isolates the extended probe pad from the edge of the device. The oxide 630 acts as insulation to cover the vertical edge of the drift region 604 and drain region 602, such that when a metal is deposited on the sidewall of the device 600, said metal does not short the drift region 604 and drain region 602. For a fully-vertical Gallium Nitride (GaN) fin device, the global planarization and insulation disclosed in FIG. 6I may be omitted.

Figure 6J:
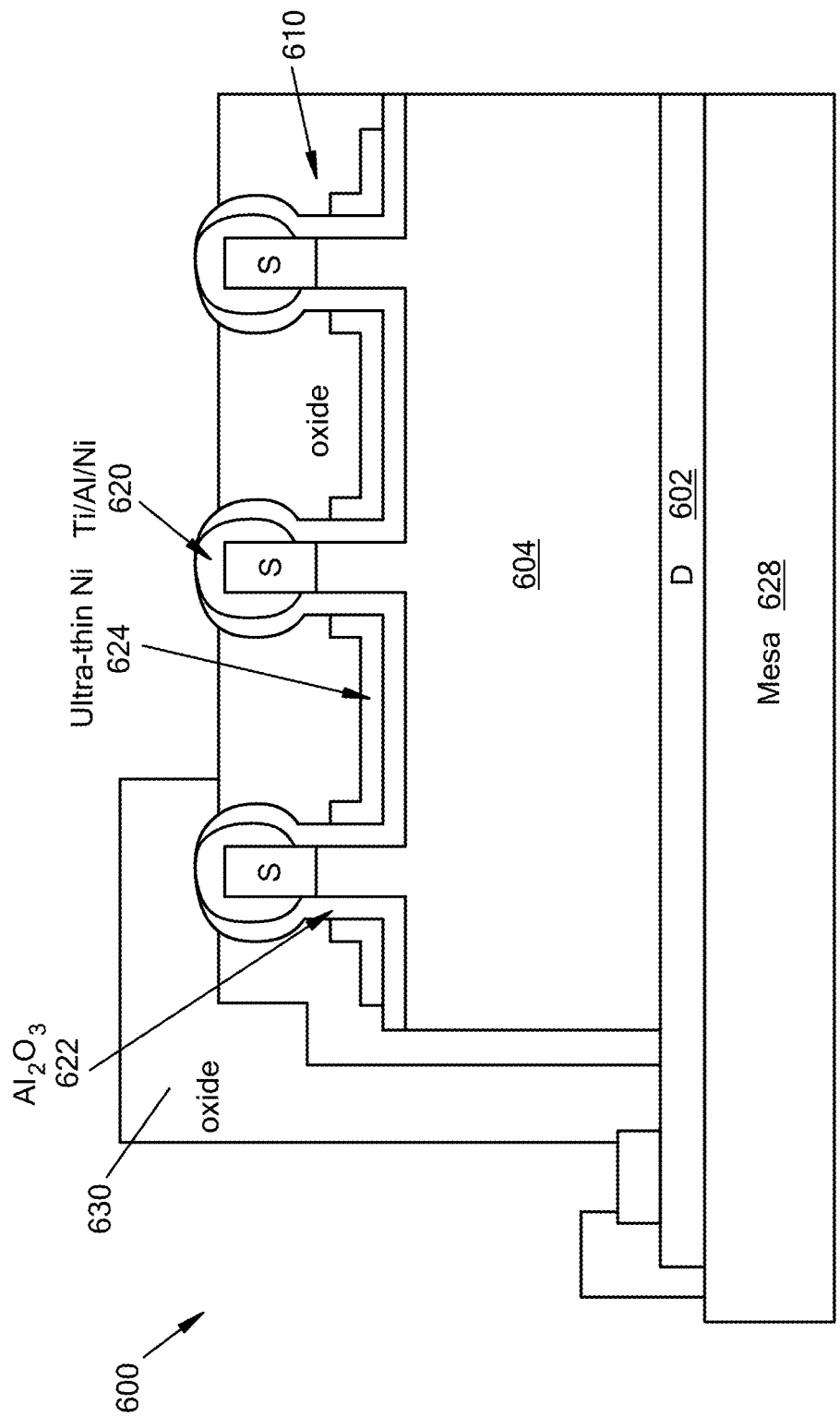

Referring to FIG. 6J, a via opening is formed in the device 600. In order to form the via opening, the layer of oxide 630 is partially etched in order to electrically access the metal contacts.

Figure 6K:
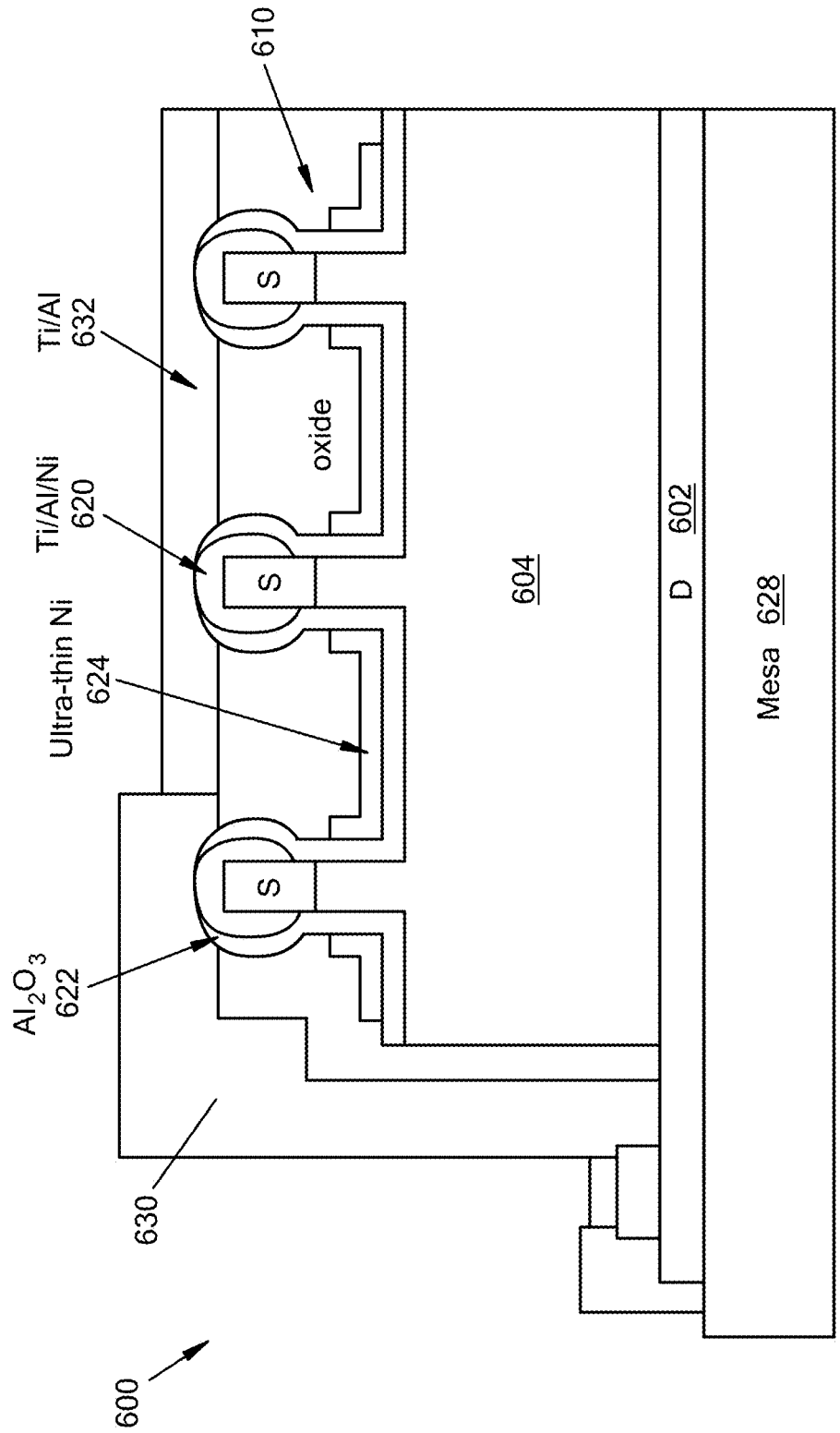

Referring to FIG. 6K, probe pads are formed on device 600. To form the probe pads, a layer of titanium/aluminum (Ti/Al) metal 632 is deposited using conformal sputtering and patterned with lithography. The source pad has an interdigitated structure with transparent slits to allow maximal light transmission and absorption in the optically active fin channels. Further, for a fully-vertical Gallium Nitride (GaN) fin device, a drain pad is deposited on the backside of the device to contact the drain layer.

Figure 7A:
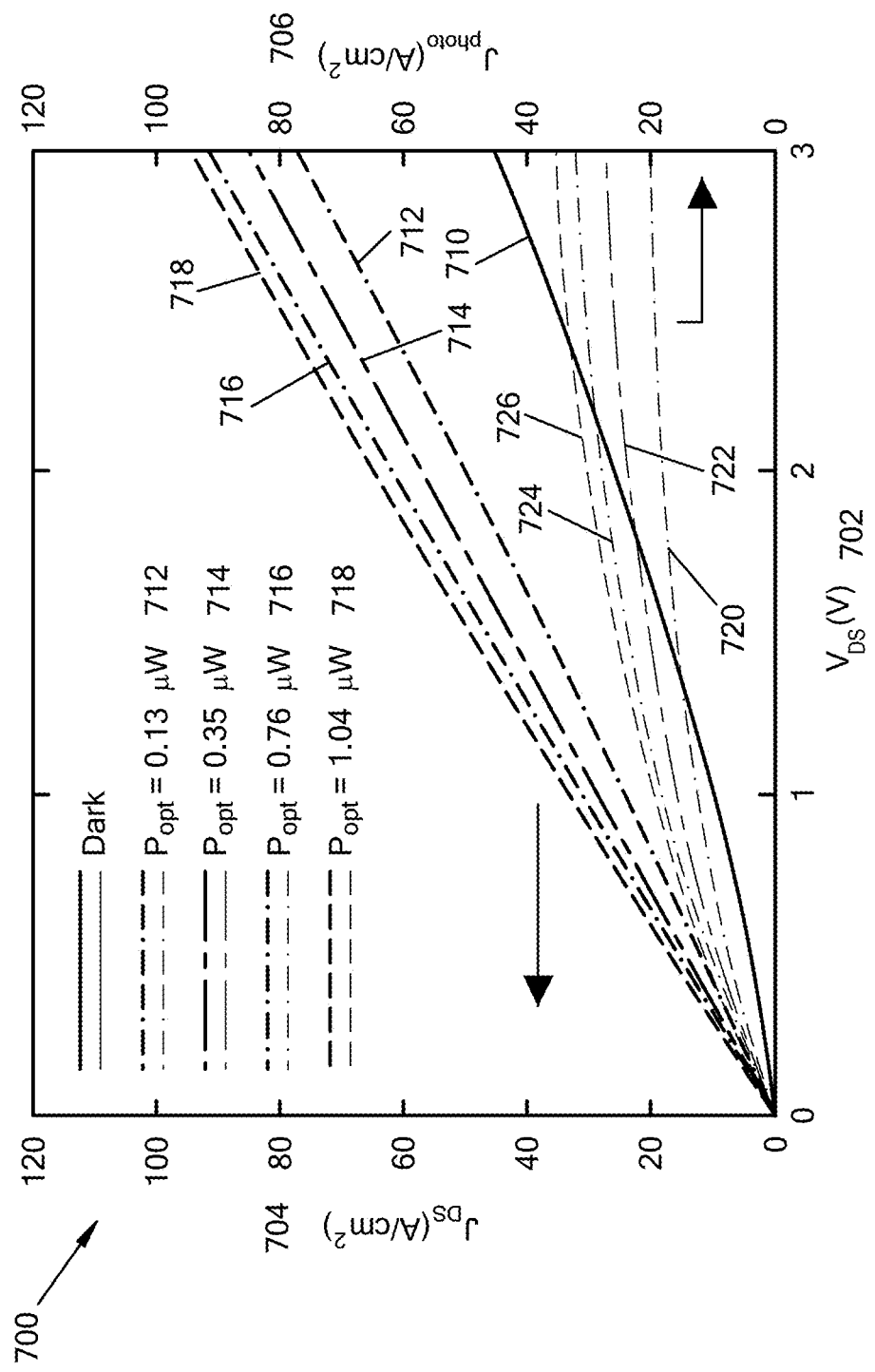
FIG. 7A is a graph of voltage (V) vs. total current density ($A/cm^2$) and photo current density ($A/cm^2$)

FIG. 7A is a graph 700 of voltage (V) 702 vs. total current density ($A/cm^2$) 704 and photo current density ($A/cm^2$) 706. Graph 700 illustrates the output characteristics of an example embodiment of a device with a fin width of 75 nm. The dotted lines 720, 722, 724, 726 illustrate the photo current density with the corresponding optical power levels. As disclosed in graph 700, an increase in optical power $P_{opt}$ results in an increase in current density, with a maximum current density exceeding 90 $A/cm^2$ with 1 µW of optical power. A first line 710 illustrates a dark state. A second line 712 illustrates the current-voltage characteristics when the fins are illuminated with an optical power of 0.13 µW, with a corresponding line 720 illustrating the photo current density. A third line 714 illustrates the current-voltage characteristics when the fins are illuminated with an optical power of 0.35 µW, with a corresponding line 722 illustrating the photo current density. A fourth line 716 illustrates the current-voltage characteristics when the fins are illuminated with an optical power of 0.76, with a corresponding line 724 illustrating the photo current density. A fifth line 718 illustrates the current-voltage characteristics when the fins are illuminated with an optical power of 1.04 µW, with a corresponding line 726 illustrating the photo current density. A photo current u W density exceeding 35 $A/cm^2$ was observed at an optical power of 1.04 µW, indicating high photo-gain.

Figure 7B:
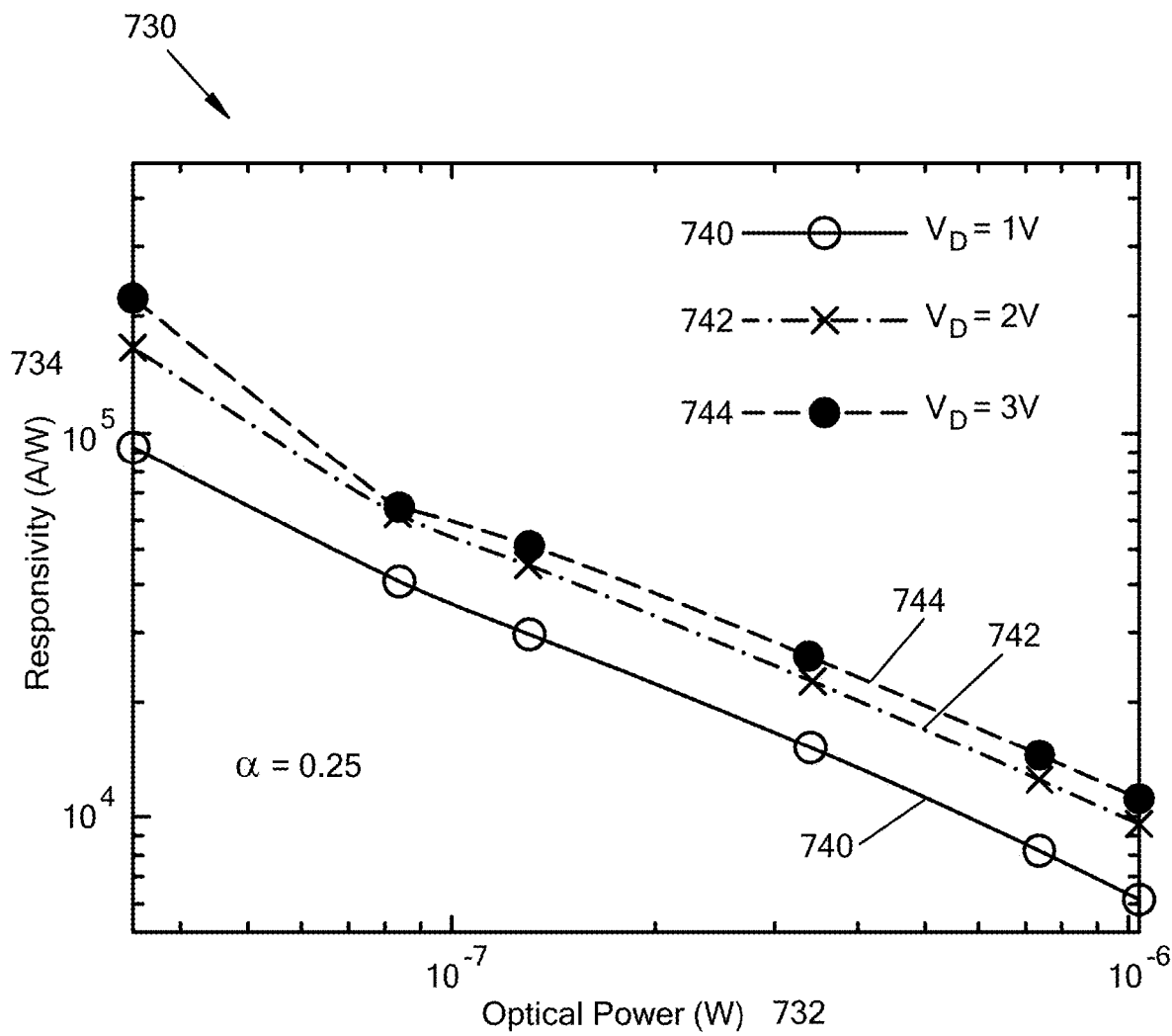
FIG. 7B is a graph of optical power (W) vs. responsivity (A/W)

FIG. 7B is a graph 730 of optical power (W) 732 vs. responsivity (A/W) 734. Responsivity measures the electrical output per optical input. Graph 730 illustrates the responsivity decreases as optical power decreases. Further, graph 730 illustrates the photo-responsivity of an example embodiment of a device with a fin width of 75 nm with extracted $\alpha=0.25$. $\alpha$ is a fitting parameter that captures photo generation and recombination rates. A smaller a indicates stronger voltaic effects, with pure photoconductivity at $\alpha=1$. A first line 740 illustrates a bias voltage of 1 V. A second line 742 illustrates a bias voltage of 2 V. A third line 744 illustrates a bias voltage of 3 V. A high responsivity exceeding 105 A/W was observed, indicating efficient generation of electrical carrier via optical signals.

Figure 7C:
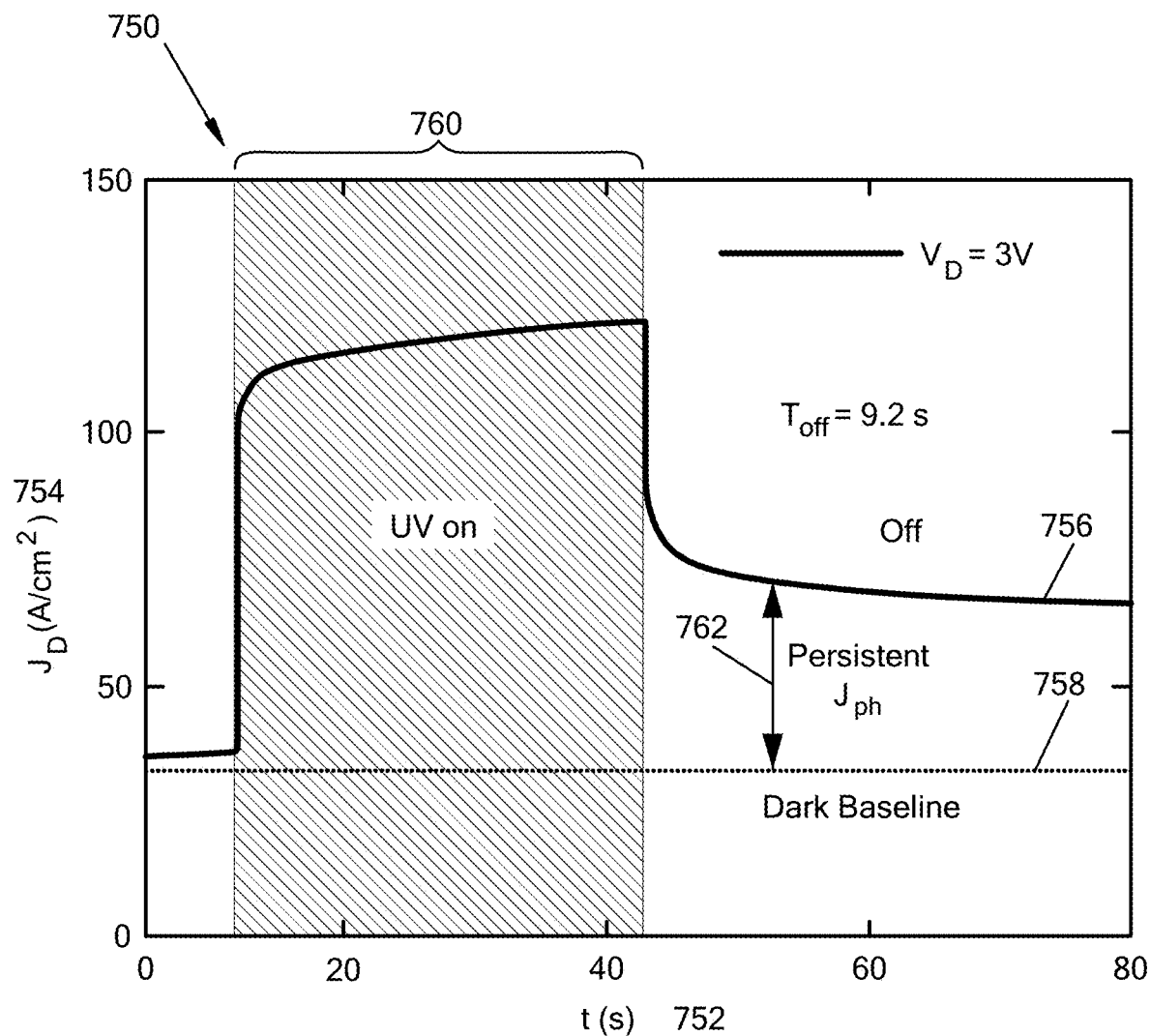
FIG. 7C is a graph of time(s) vs. current density ($A/cm^2$)

FIG. 7C is a graph 750 of time(s) 752 vs. current density ($A/cm^2$) 754. In FIG. 7C, line 756 illustrates the transient response of an example embodiment of the device, with line 758 demonstrating the dark baseline. Line 758 illustrates a bias voltage of 3 V. In a region 760, UV light is turned on. When the UV light is turned off, a persistent photocurrent ($J_{ph}$) can be observed in the region 762 between the line 756 and line 758. A time constant ($T_{off}$) was extracted from the turn off transient, $T_{off}=9.2$ s. The time constant is long, compared to conventional time constants which are often in the order of milliseconds (ms) for switching purposes. This phenomena can be utilized to form devices in other applications, which may call for a latch up switch (e.g., the device can be turned on with light, but cannot be turned off).

Figure 7D:
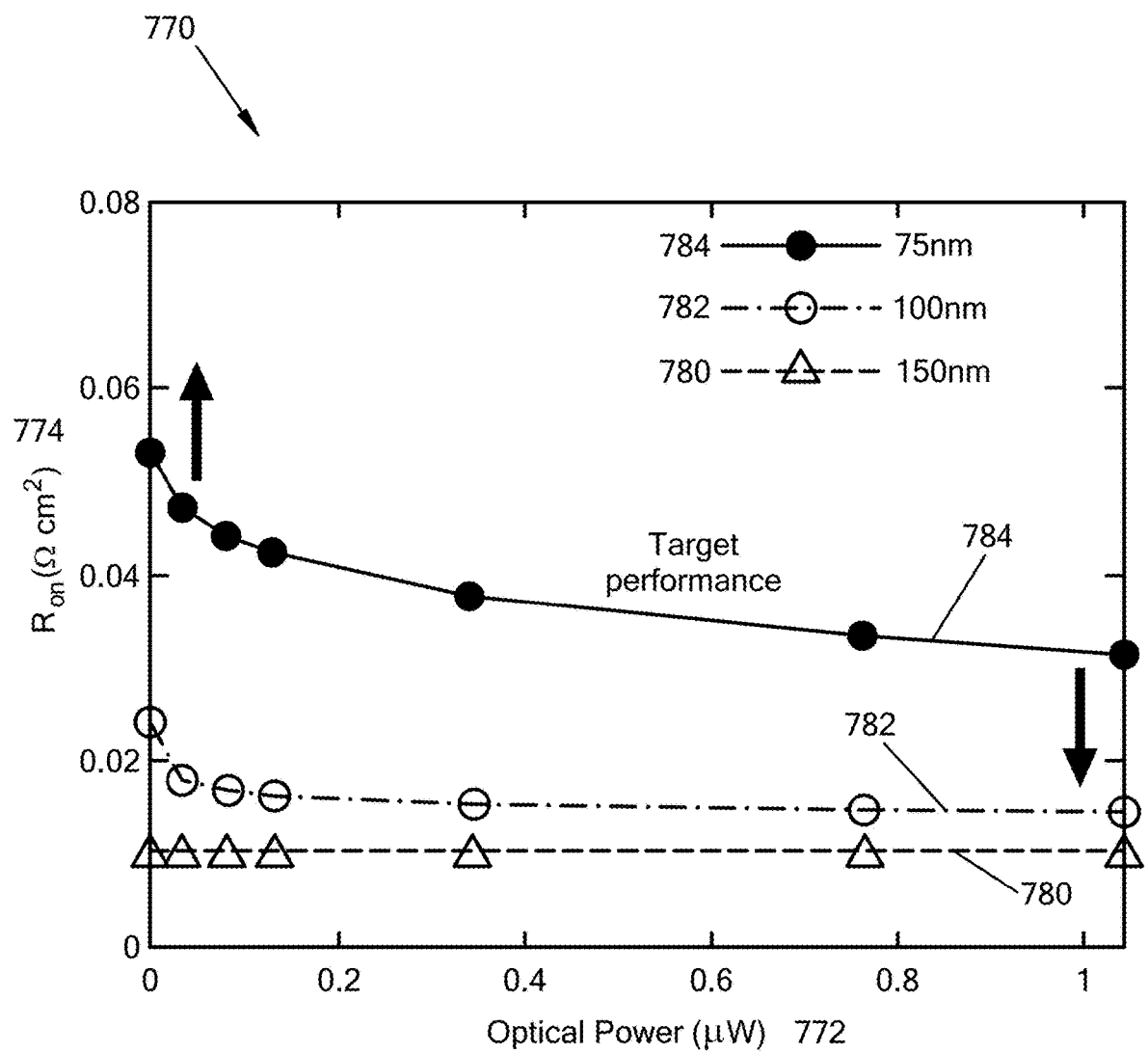
FIG. 7D is a graph of optical power ($\mu W$) vs. specific resistance (($2 cm^2$)

FIG. 7D is a graph 770 of optical power (µW) 772 vs. resistivity ($(2 cm^2)$) 774. Graph 770 demonstrates the optical modulation of devices with different fin widths. As fin widths increase, the optical modulation decreases due to higher dark current. A first line 780 represents a fin with a width of 150 nm. A second line 782 represents a fin with a width of 100 nm. A third line 784 represents a fin with a width of 75 nm. Graph 770 demonstrates the impact of fin widths on turn off behavior. A narrower fin (e.g., the fin with a width of 75 nm) improves the turn off behavior.

Figure 8B:
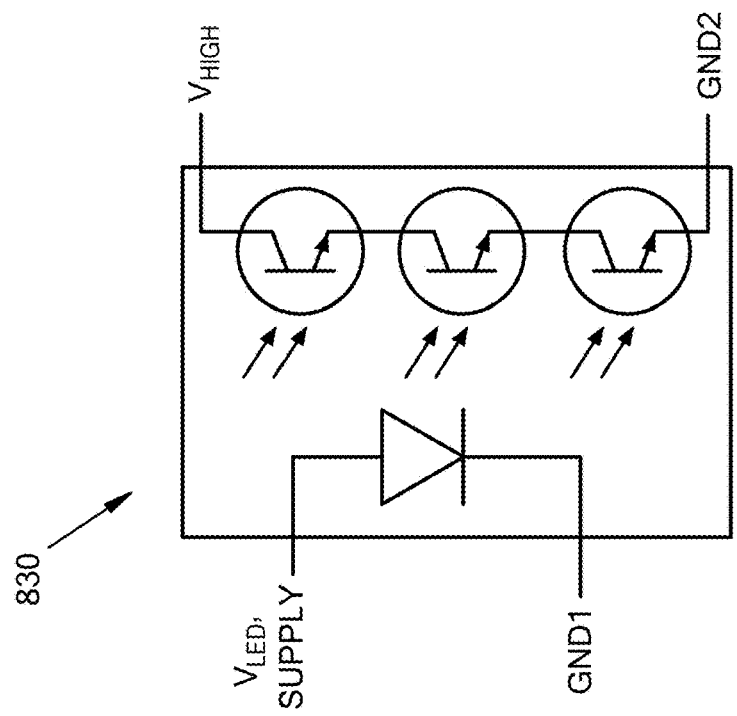
FIG. 8B is an example embodiment of a packaging scheme for integrating a light emitting diode (LED) optical driver with stacked power devices.
Figure 8A:
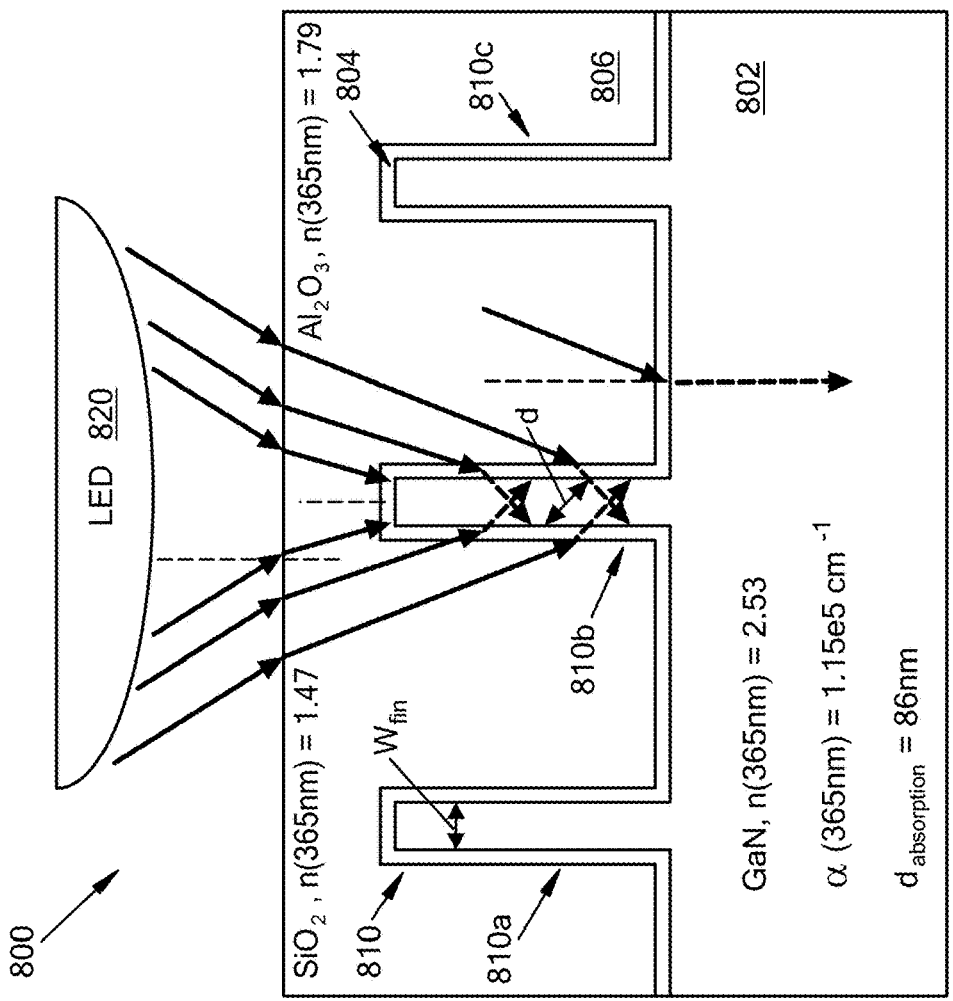
FIG. 8A is a side cross-sectional view of an example embodiment of an optics integration and packaging scheme for optically controlled power devices.

FIG. 8A is a side cross-sectional view of an example embodiment of an optics integration and packaging scheme 800 for optically controlled power devices. Scheme 800 includes one or more fin structures 810a-810c (which may be similar to or the same as the fin structures 110 described above in conjunction with FIG. 1B), generally denoted 810, are disposed over (here directly on) a drift region 802 (which may be similar to or the same as drift region described above in conjunction with FIG. 1A). The fin structures 810 may be similar to or the same as the fin transistors 502 in FIG. 5A, accordingly the fin structures 810 may be a part of a layout for an interdigitated probe pad, such as layout 500 in FIG. 5A.

A first fin structure 810a is disposed over (here directly on) the drift region 802. A second fin structure 810b is disposed adjacent to the first fin structure 810a over (here directly on) the drift region 802. A third fin structure 810c is disposed adjacent to the second fin structure 810b over (here directly on) the drift region 802. The fin structures 810 have a width $W_{fin}$ of 100 nm.

A region 804 is disposed over (here directly on) the fin structures 810, the region 804 partially covers the channel of the fin structure 810 to electrically contact the source region of the fin structures 810. The region 804 may be a gate oxide, such as aluminum oxide ($Al_2O_3$). The region 804 may have a refractive index (with a wavelength of 365 nm) of 1.79.

An optically transparent window 806 is disposed over (here directly on) the region 804 as the spacer between fin structures 810. The optically transparent window 806 may be referred to as an optically transparent windows (or spacers) between the probe pad fingers, which receive optical signal and allow the optically active material to generate charge carriers in the channels of the fin structures 810. The optically transparent window 806 may be UV-transparent $SiO_2$ with a refractive index (with a wavelength of 365 nm) of 1.47. The fin structures 810 may be formed from GaN that has a refractive index (with a wavelength of 365 nm) of 2.53. The absorption coefficient (with a wavelength of 365 nm) $a=1.15e5\ cm^{-1}$.

Region 804 and optically transparent window 806 have a lower refractive index than the channels in the fin structures 810 to form one or more optical signal guiding structures. The region 804, optically transparent window 806, and the channel form the one or more optical signal guiding structures. The optical signal guiding structures are optical probes to probe device operation. Due to refraction, light bends towards the fin structures 810, which leads to increased absorption efficiency of the optical signals.

Scheme 800 illustrates a top illumination scheme, including a non-zero divergence light source (e.g., a light emitting diode (LED), laser, or broadband light source) 820. The respective fin structures 810 have an absorption depth $d_{absorption}$, which illustrates the depth of which the optical signal from the illumination penetrates the fin structures 810. The $d_{absorption}=86$ nm for the respective fin structures 810.

Due to lower refractive index of the $SiO_2$ 806, light rays emitting from the light source 820 are bent towards the sidewall surface of GaN fins, causing optical absorption to take place in the electrically depleted channel of the fin structures 810.

The scheme 800 demonstrates a simple method for integration of the optical drivers without complex photonics design. Thanks to the waveguide-like fin array channels and the high optical responsivity of the power device, an LED optical source can be directly used to provide optical signal to generate high on-current in the device. Due to non-zero divergence of LED, light rays will fall incidentally on the respective fin structure sidewalls. Owing to a low refractive index, the oxide spacer further bends the incident light rays towards the fins for an increased absorption area.

FIG. 8B is an example embodiment of a packaging scheme 830 for integrating an LED optical driver with semiconductor devices stacked serially block a total output voltage (VHIGH) greater than 30 V. Accordingly, the enhanced blocking of the VHIGH can be greater than the breakdown voltage of a single device. In the packaging scheme 830 three devices are stacked serially, however two or more devices may be sacked serially. The total output voltage VHIGH blocked may be greater than 30 V, 35 V, or 45 V. Two or more devices may be stacked serially to block a total output voltage greater than 30 V and may be coupled to a light source. The light source may be a light emitting diode (LED), laser, or broadband light source. The packaging scheme 830 enables simple integration of the optical driver with multiple power devices stacked serially. Such a design enables the possibility for self-guiding photonic structures, free of complex design with UV-compatible optics. Due to large LED emission area (large meaning an LED emission area between 1 $mm^2$ to-10 $cm^2$), a single LED or LED array can be used to drive multiple power devices at the same time. Serially stacked power devices with VHIGH can be driven simultaneously without needing complex gate drivers and control schemes. Such topology demonstrates the possibility to develop a low-EMI, fully isolated circuit with greatly enhanced reliability, cost effectiveness and system compactness.

The present disclosure provides a device structure for optically controlled power devices based on wide band gap semiconductors, such as GaN. The proposed device results in a large (large meaning greater than 104 A/W) optical responsivity with high on-current density (high meaning 100 $A/cm^2$ at $V_D=3$ V), comparable to the conventional electrically controlled SiC power MOSFET. Furthermore, the proposed power device can be turned on by a low-power optical source, such as an LED (with an optical intensity of about 15 $mW/cm^2$ (+/−10 $mW/cm^2$)), which significantly reduces the cost and complexity of optics integration. These results demonstrate the great potential of the claimed concepts to enable low-cost, low-complexity, compact, and reliable high-voltage power systems.

The optically controlled, wide band gap semiconductor power device with a nanostructured channel provides extraordinarily high optical responsivity. The device shows high on current density (high referring to an on current density greater than 90 $A/cm^2$ at $V_{DS}=3$ V) with a low-power (low-power meaning $\lambda=365$ nm, $P_{opt}=5uW$) UV LED source, which translates into a responsivity greater than $10^4$ A/W. The disclosure further includes methods to increase the triggering wavelength of the proposed device, as well as auxiliary structures to further suppress the off state dark current. A method to integrate the optical driver with stacked power transistors is also disclosed. The integration scheme allows optically controlled devices to be illuminated from the top, which simplifies the optics design required to turn on the device. Such integration method allows simple stacking of multiple optically controlled devices to achieve high blocking voltages, thus, enabling high voltage, high current power electronics with significantly enhanced EMI immunity, cost-effectiveness, system simplicity and reliability. In view of the above, after reading the disclosure provided herein, those of ordinary skill in the art will appreciate that devices described hereinabove are suitable for use as semiconductor power switches (e.g., GaN power switches).

Various embodiments of the concepts, systems, devices, structures and techniques sought to be protected are described herein with reference to the related drawings. Alternative embodiments can be devised without departing from the scope of the concepts, systems, devices, structures and techniques described herein. It is noted that various connections and positional relationships (e.g., over, below, adjacent, etc.) are set forth between elements in the following description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). The following definitions and abbreviations are to be used for the interpretation of the claims and the specification. As used herein, the terms "comprises," "comprising, "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. The term "one or more" is understood to include any integer number greater than or equal to one, i.e. one, two, three, four, etc.

References in the specification to "one embodiment, "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "vertical," "horizontal," "top," "bottom," and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element.

The terms "approximately" and "about" may be used to mean within +20% of a target value in some embodiments, within +10% of a target value in some embodiments, within +5% of a target value in some embodiments, and yet within +2% of a target value in some embodiments. The terms "approximately" and "about" may include the target value.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

What is claimed is:

1. A semiconductor structure, comprising:
   a drain region;
   a drift region comprised of a wide band gap material disposed over the drain region; and
   an optically active material disposed over the drift region to form a channel structure, the optically active material to generate charge carriers in response to an optical signal incident thereon; and
   a source region disposed over the optically active material such that without an optical signal incident on the optically active material, charge carriers in the optically active material are depleted to turn off the semiconductor structure, and with an optical signal incident on the optically active material, charge carriers in the optically active material conduct a current in the semiconductor structure when an electric field is applied across the source region and drain region, causing the current to substantially flow directly between the source region and the drain region.

2. The semiconductor structure of claim 1, wherein the wide band gap material comprises one or more of: gallium nitride (GaN), aluminum gallium nitride ($Al_xGa_yN$, x+y=1), aluminum nitride (AlN), boron aluminum nitride ($B_xA_yN$, x+y=1), gallium oxide ($Ga_2O_3$), silicon carbide (SiC), diamond, or boron nitride (BN).

3. The semiconductor structure of claim 1, wherein the drain region, the drift region, and the source region have a same type of net electrical carriers.

4. The semiconductor structure of claim 1, wherein the channel structure comprises a nanostructure having a width less than 1 µm.

5. The semiconductor structure of claim 1, wherein the optically active material includes one or more energy levels with an energy level to conduction band difference greater than 0.5 eV.

6. The semiconductor structure of claim 1, further comprising a stack including a first layer comprised of a dielectric material disposed over the drift region and the optically active material and a second layer comprised of a semi-transparent or transparent conductive oxide disposed over the first layer.

7. The semiconductor structure of claim 1, further comprising a material layer with a net carrier type opposite to that of the optically active material disposed over the optically active material and the drift region.

8. The semiconductor structure of claim 1, wherein the optically active material further comprises a narrow band gap material or a material with net carrier type opposite to that of the source region and the drain region.

9. The semiconductor structure of claim 1, further comprising a narrow band gap absorber disposed over the optically active material and the drift region, wherein the narrow band gap absorber comprises one or more of organic molecules, colloidal quantum dots, two dimensional materials, group IV elements, or III-nitride alloys.

10. The semiconductor structure of claim 1, further comprising an interdigitated probe pad with a region partially covering the channel structure to electrically contact the source region and an optically transparent window to receive an optical signal and allow the optically active material to generate charge carriers in the channel structure.

11. The semiconductor structure of claim 10, wherein the region and the optically transparent window have a lower refractive index than the optically active material to form one or more optical signal guiding structures, wherein the optical signal guiding structures are optical probes to probe device operation.

12. The semiconductor structure of claim 1, wherein two or more semiconductor devices are stacked serially to block a total output voltage greater than 30 V.

13. The semiconductor structure of claim 12, further comprising a light source, wherein the light source is a light emitting diode (LED), laser, or broadband light source.

14. A semiconductor structure, comprising:
   a drift region comprised of a wide band gap material;
   a barrier region disposed over the drift region;
   one or more channels at an interface of the barrier region and the drift region;

a source contact disposed on a first surface of the barrier region to form a source region in electrical communication with at least some of the one or more channels;

a drain contact disposed on the first surface of the barrier region to form a drain region in electrical communication with at least some of the one or more channels and adjacent to the source region; and an optically active material disposed over the first surface of the barrier region between the source contact and the drain contact, wherein the optically active material generates charge carriers in response to an optical signal, wherein in an off state charge carriers in the channels are depleted to turn off the semiconductor structure, and in an on state charge carriers in the channels conduct a current in the semiconductor structure when an electric field is applied across the source region and the drain region, causing current to substantially flow through at least some of the one or more channels directly between the source region and the drain region.

15. The semiconductor structure of claim 14, wherein the wide band gap material comprises one or more of: gallium nitride (GaN), aluminum gallium nitride ($Al_xGa_yN$, where x+y=1), aluminum nitride (AlN), boron aluminum nitride ($B_xA_yN$, where x+y=1), gallium oxide ($Ga_2O_3$), silicon carbide (SiC), diamond, or boron nitride (BN).

16. The semiconductor structure of claim 14, wherein the channels are nanostructured.

17. The semiconductor structure of claim 16, further comprising a narrow band gap absorber disposed over the channels, wherein the narrow band gap absorber comprises one or more of organic molecules, colloidal quantum dots, two dimensional materials, group IV elements, or III-nitride alloys.

18. The semiconductor structure of claim 14, wherein the optically active material comprises a material with a net electrical carrier type opposite to that of the channels.

19. The semiconductor structure of claim 14, further comprising a region partially covering the channels to electrically contact the source region and an optically transparent window to receive the optical signal and allow the optically active material to generate charge carriers in the channels, wherein the region and the optically transparent window have a lower refractive index than the channels to form one or more optical signal guiding structures, wherein the optical signal guiding structures are optical probes to probe device operation.

20. The semiconductor structure of claim 14, wherein two or more semiconductor devices are stacked serially to block a total output voltage greater than 30 V and are coupled to a light source, wherein the light source is a light emitting diode (LED), laser, or broadband light source.

* * * * *